(12) United States Patent
Yanagawa

(10) Patent No.: US 8,572,424 B2
(45) Date of Patent: Oct. 29, 2013

(54) SEMICONDUCTOR DEVICE TO SELECT AND OUTPUT DATA TO A DATA BUS

(75) Inventor: Miki Yanagawa, Kawasaki (JP)

(73) Assignee: Fujitsu Semiconductor Limited, Yokohama (JP)

(*) Notice: Subject to any disclaimer, the term of this patent is extended or adjusted under 35 U.S.C. 154(b) by 1431 days.

(21) Appl. No.: 11/806,327

(22) Filed: May 31, 2007

(65) Prior Publication Data

US 2007/0240009 A1 Oct. 11, 2007

Related U.S. Application Data

(62) Division of application No. 10/361,620, filed on Feb. 11, 2003, now Pat. No. 7,243,252.

(30) Foreign Application Priority Data

Apr. 10, 2002 (JP) ................................. 2002-107350

(51) Int. Cl.
*G06F 13/42* (2006.01)
(52) U.S. Cl.
USPC ............................................ 713/400; 710/66
(58) Field of Classification Search
USPC ........................................................ 713/400
See application file for complete search history.

(56) References Cited

U.S. PATENT DOCUMENTS

| 5,289,584 | A | 2/1994 | Thome et al. |
| 5,748,917 | A | 5/1998 | Krein et al. |
| 5,896,347 | A | 4/1999 | Tomita et al. |
| 6,275,441 | B1 * | 8/2001 | Oh .............................. 365/189.18 |
| 6,754,865 | B2 | 6/2004 | Haraguchi |
| 7,337,260 | B2 * | 2/2008 | Anjo et al. ..................... 710/307 |

FOREIGN PATENT DOCUMENTS

| JP | 7-007438 A | 1/1995 |
| JP | 10-322224 A | 12/1998 |
| JP | 11-112357 A | 4/1999 |
| JP | 11-317669 A | 11/1999 |
| JP | 2001-290457 A | 10/2001 |
| JP | 2002-007318 A | 1/2002 |

* cited by examiner

*Primary Examiner* — Kim Huynh
*Assistant Examiner* — Eric Chang
(74) *Attorney, Agent, or Firm* — Arent Fox LLP

(57) ABSTRACT

A semiconductor device that can transmit data in wide bus width regardless of the width of an external data bus connected thereto. In a semiconductor device on the data output side, m-bit internal data is divided into n blocks. A data selection circuit selects m/n pieces of data at a time and a data output section outputs these pieces of data to an external data bus of a width of L(=m/n) bits. At this time an output control circuit controls the selection of data by the data selection circuit and a synchronous signal output section outputs a synchronous signal indicative of selected data. In a semiconductor device on the data input side, a data input section accepts data transferred via an external data bus and a data get circuit outputs the data to an internal data bus corresponding to a synchronous signal a synchronous signal input section accepted. By getting data corresponding to all synchronous signals, the data get circuit will get m-bit data.

20 Claims, 22 Drawing Sheets

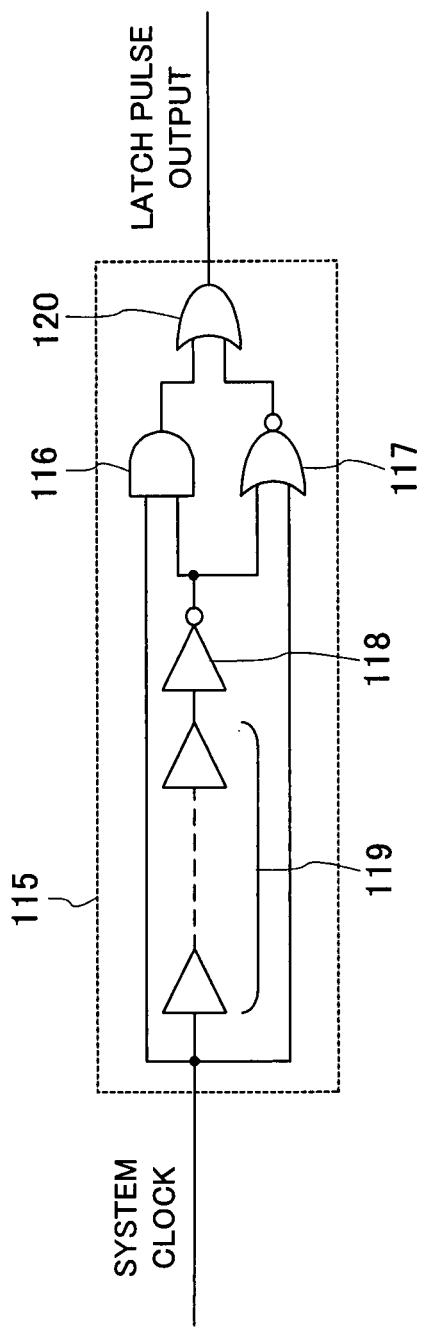
FIG. 19 (A) PRIOR ART
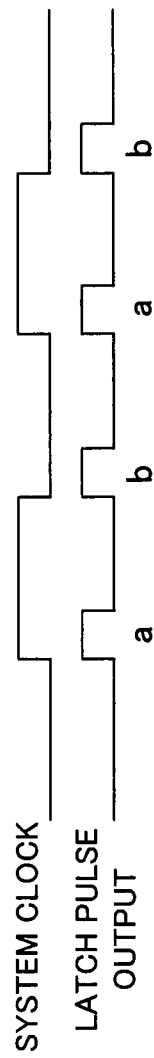
FIG. 19 (B) PRIOR ART

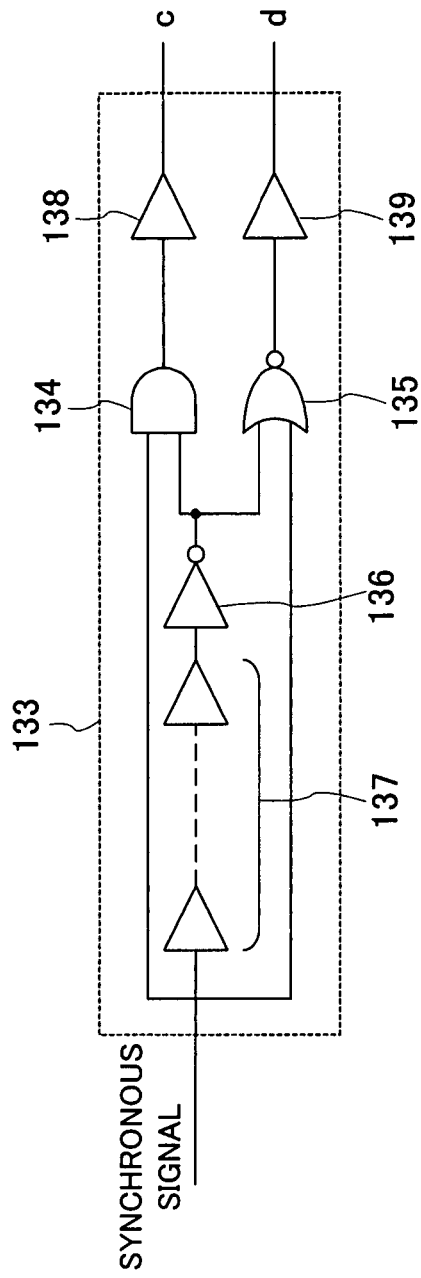
FIG. 22 (A) PRIOR ART
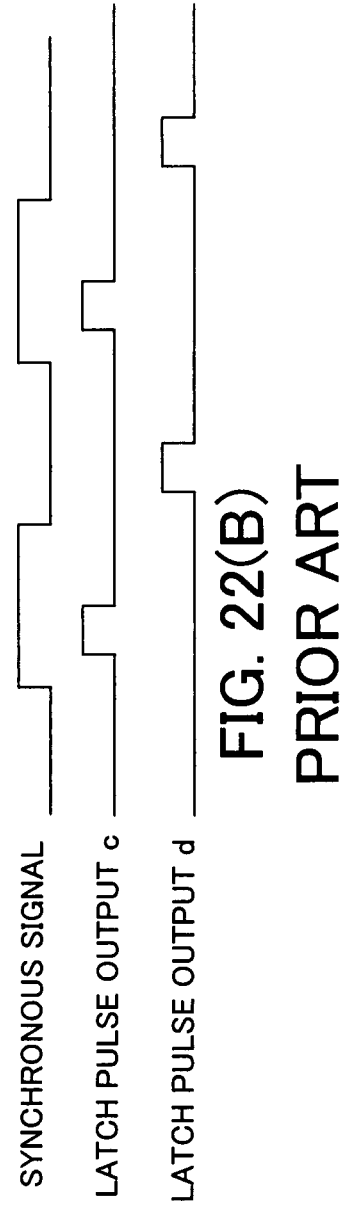
FIG. 22(B) PRIOR ART

SEMICONDUCTOR DEVICE TO SELECT AND OUTPUT DATA TO A DATA BUS

CROSS-REFERENCE TO RELATED APPLICATIONS

This application is a divisional of U.S. patent application Ser. No. 10/361,620, filed Feb. 11, 2003, now U.S. Pat. No. 7,243,252 which is based upon and claims the benefits of priority from the prior Japanese Patent Application No. 2002-107350, filed on Apr. 10, 2002, the entire contents of which are incorporated herein by reference.

BACKGROUND OF THE INVENTION (1) Field of the Invention

This invention relates to a semiconductor device and, more particularly, to a semiconductor device which can transmit data having a bus width wider than the width of an external data bus.

(2) Description of the Related Art

With devices of a command input type represented by synchronous dynamic random access memories (DRAMs), usually data and a command are sent at the same time and are got at the leading edge of a system clock. A method under which data is got only once at the leading edge of a clock in this way is called a single data rate (SDR) type. Now, an example of a circuit for transferring data in a synchronous device into which data is got in synchronization with a system clock will be shown.

FIG. 15 is a circuit diagram showing an example of conventional circuits for transferring data. FIG. 16 is a view showing an example of the waveforms of data transferred under the single data rate method.

In the example shown in FIG. 15, the number of internal data buses 102 included in an output side device 100 is the same as that of internal data buses 103 included in an input side device 101. The number of external data buses 104 connected to the output side device 100 is the same as that of the external data buses 104 connected to the input side device 101. Command lines are also connected to the output side device 100 and the input side device 101 on a one-to-one basis. Output latch circuits 105 and output buffer circuits 106 are located on the output side of the internal data buses 102 in the output side device 100. Input buffer circuits 107 and input latch circuits 108 are located on the input side of the internal data buses 103 in the input side device 101. A system clock is supplied to the output latch circuits 105 in the output side device 100 and the input latch circuits 108 in the input side device 101.

The output side device 100 transfers data and a command in synchronization with a system clock. That is to say, the output latch circuits 105 latch data from the internal data buses 102 and a command from the command lines at the leading edge of a system clock and send the data and command to the external data buses 104 and command lines, respectively, via the output buffer circuits 106. The input buffer circuits 107 in the input side device 101 accept the data and command transferred via the external data buses 104 and command lines respectively. Then the input latch circuits 108 latch and hold the data and command at the leading edge of the system clock and output them to the internal data buses 103.

The output side device 100 begins to output on the basis of the leading edge of the system clock. As shown in FIG. 16, however, delay D corresponding to a half cycle of the system clock is produced in data sent to the external data buses 104 to satisfy appropriate setup time the input side device 101 needs to get the data. As a result, the input side device 101 can latch data and command during the available period of the data and command with the timing of the leading edge of the system clock.

Usually data of a width processed by one command is sent by the internal data buses 102 and 103 and external data buses 104. If data of a width wider than the width of a bus is sent, one method is to divide the data among a plurality of clocks.

FIG. 17 is a view showing an example of the waveforms of data of a width twice the width of a bus which is transferred under the single data rate method.

If data of a width twice the width of a bus is transferred, the data corresponding to one command is divided between two clocks and is transferred. That is to say, the first half of the data, together with the command, is sent with the first clock and only the latter half of the data is sent with the second clock. If data of a width twice the width of a bus is transferred in this way under the single data rate method, another command cannot be issued (no operation is issued) while the latter half of the data is being sent. This will degrade the effective performance of a system.

In contrast, there are devices of a double data rate (DDR) type which can get data of a width twice the width of a bus not only with the leading edge of a clock signal but also with the trailing edge of the clock signal.

FIG. 18 is a circuit diagram showing an example of conventional output side devices of the double data rate type. FIGS. 19(A) and 19(B) are views showing an example of a latch pulse generation circuit. FIG. 19(A) is a circuit diagram of a latch pulse generation circuit. FIG. 19(B) is a view showing the waveforms of input to and output from the latch pulse generation circuit. FIG. 20 is a circuit diagram showing an example of a data selector.

It is assumed that an output side device 110 includes an internal data bus of a width of m bits. Then data is divided into two data blocks and is transferred with one cycle of a system clock. Therefore, the output side device 110 includes data selectors 111 with two input terminals A and B and one output terminal O. Input terminal A of each data selector 111 accepts data included in the first data block. Input terminal B of each data selector 111 accepts data included in the second data block. Output terminal O of each data selector 111 is connected to an external data bus 114 via a latch circuit 112 and output buffer 113. The total number of the external data buses 114 is m/2. The latch circuit 112 for latching data is controlled by a latch pulse generation circuit 115. The data selectors 111 and the latch pulse generation circuit 115 operate on the basis of a system clock, which is output via an output buffer as a synchronous signal (strobe signal).

As shown in FIG. 19, the latch pulse generation circuit 115 includes an AND gate 116 and NOR gate 117. One input terminal of the AND gate 116 and one input terminal of the NOR gate 117 are connected directly to a system clock. The other input terminal of the AND gate 116 and the other input terminal of the NOR gate 117 are connected to output of an inverter 118. A delay circuit 119 for adjusting the width of a latch pulse which inputs and delays a system clock is connected to input of the inverter 118. Output of the AND gate 116 and NOR gate 117 is connected to input of an OR gate 120. Output from the OR gate 120 is output from the latch pulse generation circuit 115.

In the latch pulse generation circuit 115 the AND gate 116 outputs latch pulse a in response to the leading edge of a system clock and the NOR gate 117 outputs latch pulse b in response to the trailing edge of the system clock. The widths of latch pulses a and b correspond to delay time created by the delay circuit 119.

As shown in FIG. 20, the data selector 111 includes NAND gates 121 and 122. The input terminal A of the data selector 111 is connected to one input terminal of the NAND gate 121 and the input terminal B of the data selector 111 is connected to one input terminal of the NAND gate 122. Output of the NAND gates 121 and 122 is connected to input of a NAND gate 123. Output of the NAND gate 123 is connected to the output terminal O of the data selector 111. The other input terminal of the NAND gate 121 is connected directly to a system clock and the other input terminal of the NAND gate 122 is connected to output of an inverter 124 which accepts the system clock at the input.

When a system clock is at the low level in the data selector 111, the NAND gate 121 permits data input from the input terminal A and the NAND gate 122 prohibits data input from the input terminal B. In contrast, when a system clock is at the high level, the NAND gate 121 prohibits data input from the input terminal A and the NAND gate 122 permits data input from the input terminal B.

In the output side device 110 having the above structure, the data selectors 111 alternately select data 0 through m/2−1, respectively, included in a first half data block and data m/2 through m−1, respectively, included in a second half data block every half cycle of a system clock. The latch circuits 112 latch data 0 through m/2−1, respectively, included in the first half data block in response to latch pulse a from the latch pulse generation circuit 115 and output them to the external data buses 114 via the output buffers 113. Moreover, the latch circuits 112 latch data m/2 through m−1, respectively, included in the second half data block in response to latch pulse b and output them to the external data buses 114 via the output buffers 113.

FIG. 21 is a circuit diagram showing an example of conventional input side devices of the double data rate type. FIGS. 22(A) and 22(B) are views showing an example of a latch pulse generation circuit. FIG. 22(A) is a circuit diagram of a latch pulse generation circuit. FIG. 22(B) is a view showing the waveforms of input to and output from the latch pulse generation circuit.

In an input side device 130 data is accepted by input buffers 131. Output of each input buffer 131 is connected to input of two latch circuits 132. Control input of one of each pair of latch circuits 132 is connected to one output terminal c of a latch pulse generation circuit 133. Control input of the other of each pair of latch circuits 132 is connected to the other output terminal d of the latch pulse generation circuit 133.

As shown in FIG. 22, the latch pulse generation circuit 133 includes an AND gate 134 and NOR gate 135. One input terminal of the AND gate 134 and one input terminal of the NOR gate 135 are connected directly to a system clock. The other input terminal of the AND gate 134 and the other input terminal of the NOR gate 135 are connected to output of an inverter 136. A delay circuit 137 for adjusting the width of a latch pulse which inputs and delays a system clock is connected to input of the inverter 136. Output of the AND gate 134 is connected to a delay circuit 138 for adjusting setup time. Output of the delay circuit 138 is the output c of the latch pulse generation circuit 133. Output of the NOR gate 135 is connected to input of a delay circuit 139 for adjusting setup time. Output of the delay circuit 139 is the output d of the latch pulse generation circuit 133.

In the latch pulse generation circuit 133 the AND gate 134 outputs a latch pulse in response to the leading edge of a synchronous signal. This latch pulse is delayed by the delay circuit 138 and is output from the output c. The NOR gate 135 outputs a latch pulse in response to the trailing edge of the synchronous signal. This latch pulse is delayed by the delay circuit 139 and is output from the output d.

In the input side device 130 having the above structure, the latch pulse generation circuit 133 generates a first latch pulse during the period for which a synchronous signal is at the low level, and generates a second latch pulse during the period for which the synchronous signal is at the high level. The latch circuits 132 alternately latch data which they accepted via the input buffers 131 in response to these first and second latch pulses. By doing so, data included in a first half data block and data included in a second half data block are allotted to internal data buses. That is to say, the latch circuits 132 which operate by a latch pulse from the output c of the latch pulse generation circuit 133 get data 0 through m/2−1, respectively, included in the first half data block and the latch circuits 132 which operate by a latch pulse from the output d of the latch pulse generation circuit 133 get data m/2 through m−1, respectively, included in the second half data block.

As stated above, the amount of data which a device of the double data rate type can transfer during one cycle of a system clock is twice the amount of data which a device of the single data rate type can transfer. With devices of the double data rate type, a command is usually got only at the leading edge of a system clock and data is got twice by one command.

The data transfer rate of a device of the double data rate type is twice the data transfer rate of a device of the single data rate type. As a result, the available period of data for a device of the double data rate type is half of the available period of data for a device of the single data rate type and setup time for a clock for getting data for a device of the double data rate type is also half of setup time for a clock for getting data for a device of the single data rate type. However, the characteristics of a pull-up transistor and pull-down transistor in a driver for driving a clock are not necessarily the same in some operating environments. This makes it difficult to keep setup time and hold time at the time of getting data optimal.

Furthermore, if data is divided into n blocks and is transferred, the head of the data must be realized correctly to rearrange the n blocks transferred. This applies both to a device of the single data rate type and to a device of the doubled at a rate type. Usually an effective command or the like, together with the leading data, is transferred to indicate the head of data. In this case, however, a circuit for interpreting the command and generating a data latch signal gets complicated.

SUMMARY OF THE INVENTION

The present invention was made under the background circumstances as described above. An object of the present invention is to provide a semiconductor device which can transmit data in wide bus width regardless of the width of an external data bus connected thereto.

In order to achieve the above object, a semiconductor device which outputs internal data to an external data bus of a width narrower than the width of an internal data bus is provided. This semiconductor device comprises a data selection circuit for selecting data from n divided data blocks on an internal data bus of a width of m bits, a data output section for outputting the data in the data block selected by the data selection circuit to an external data bus of a width of m/n bits, an output control circuit for generating n selection signals in order in response to an output start signal and for controlling so that the data selection circuit will select data according to the data blocks, and a synchronous signal output section for outputting the selection signals to synchronous signal lines as strobe signals.

Furthermore, in order to achieve the above object, a semiconductor device which inputs data transferred via an external data bus of a width narrower than that of an internal data bus is provided. This semiconductor device comprises a data input section for inputting data on an external data bus of a width being an nth of an internal data bus of a width of m bits, a synchronous signal input section for inputting n strobe signals indicative of n divided data blocks transferred, and a data get circuit for getting data input to the data input section and for assigning the data to an internal data bus corresponding to a data block specified by the strobe signals.

The above and other objects, features and advantages of the present invention will become apparent from the following description when taken in conjunction with the accompanying drawings which illustrate preferred embodiments of the present invention by way of example.

BRIEF DESCRIPTION OF THE DRAWINGS

FIGS. 19(A) and 19(B) are views showing an example of a latch pulse generation circuit, FIG. 19(A) being a circuit diagram of a latch pulse generation circuit, FIG. 19(B) being a view showing the waveforms of input to and output from the latch pulse generation circuit.

FIGS. 22(A) and 22(B) are views showing an example of a latch pulse generation circuit, FIG. 22(A) being a circuit diagram of a latch pulse generation circuit, FIG. 22(B) being a view showing the waveforms of input to and output from the latch pulse generation circuit.

DESCRIPTION OF THE PREFERRED EMBODIMENTS

An overview of the present invention will now be given with reference to the drawings.

Figure 1:
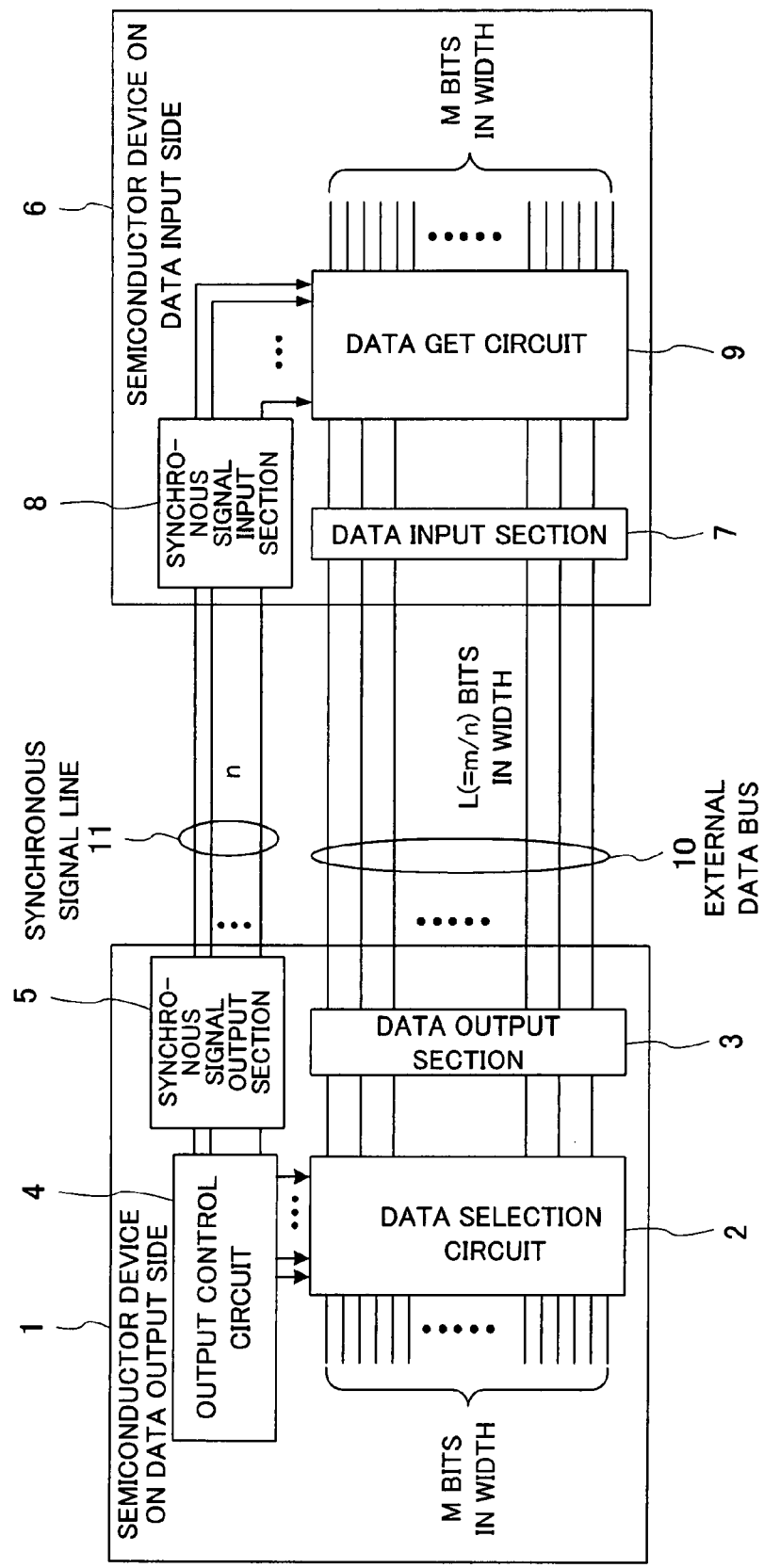
FIG. 1 is a block diagram showing the theoretical structure of a data transfer by semiconductor devices according to the present invention.

FIG. 1 is a block diagram showing the theoretical structure of a data transfer by semiconductor devices according to the present invention.

First, a semiconductor device 1 with an internal data bus of a width of m bits which is located on the output side of data on this internal data bus will be described. The semiconductor device 1 on the data output side comprises a data selection circuit 2 for dividing m-bit data on internal data buses into n data blocks and for selecting the data blocks in order, a data output section 3 for outputting L(=m/n) pieces of data selected by the data selection circuit 2, an output control circuit 4 for controlling the selection of data in a data block by the data selection circuit 2, and a synchronous signal output section 5 for outputting n synchronous signals indicative of data in a data block selected by the data selection circuit 2.

A semiconductor device 6 on the data input side comprises a data input section 7 for inputting L pieces of data transferred, a synchronous signal input section 8 for inputting n synchronous signals indicative of data in a data block transferred, and a data get circuit 9 for getting data input to the data input section 7 as data in a data block indicated by synchronous signals input to the synchronous signal input section 8.

The data output section 3 in the semiconductor device 1 on the data output side and the data input section 7 in the semiconductor device 6 on the data input side are connected by an external data bus 10 of a width of L bits. The synchronous signal output section 5 in the semiconductor device 1 on the data output side and the synchronous signal input section 8 in the semiconductor device 6 on the data input side are connected by n synchronous signal lines 11.

In the semiconductor device 1 on the data output side in a system having the above structure, the data selection circuit 2 first selects each of n data blocks obtained by dividing data on the internal data bus of a width of m bits. This selection is made in order by n selection signals supplied from the output control circuit 4. L(=m/n) pieces of data selected by the data selection circuit 2 are output to the external data bus 10 via the data output section 3. At this time the synchronous signal output section 5 outputs a synchronous signal indicative of data in a data block transferred by the data output section 3 to the synchronous signal lines 11.

The data input section 7 in the semiconductor device 6 on the data input side accepts data transferred according to blocks via the external data bus 10. When the data input section 7 accepts a data block, the synchronous signal input section 8 accepts a synchronous signal indicative of a data block which includes the data. The data get circuit 9 outputs the data the data input section 7 accepted to an internal data bus for a data block corresponding to the synchronous signal the synchronous signal input section 8 accepted. Similarly, when the synchronous signal input section 8 accepts the next synchronous signal, the data get circuit 9 outputs data the data input section 7 accepted to an internal data bus for a data block corresponding to the synchronous signal. By the data get circuit 9 getting data in data blocks corresponding to all synchronous signals, m-bit data will be got into the semiconductor device 6 on the data input side.

As stated above, the semiconductor device 1 on the data output side divides data into n blocks, transfers them, and transfers n synchronous signals with them. The semiconductor device 6 on the data input side outputs in order data transferred one block at a time to an internal data bus for each block. This enables the reconstruction of m-bit data. As a result, data in wide bus width can be transmitted regardless of the width of an external data bus.

Now, an embodiment of the present invention will be described in detail with a case where an internal data bus is 288(=m) bits in width, an external data bus is 72(=L) bits in width, and data is divided into four(=n) data blocks and is transferred as an example.

Figure 2:
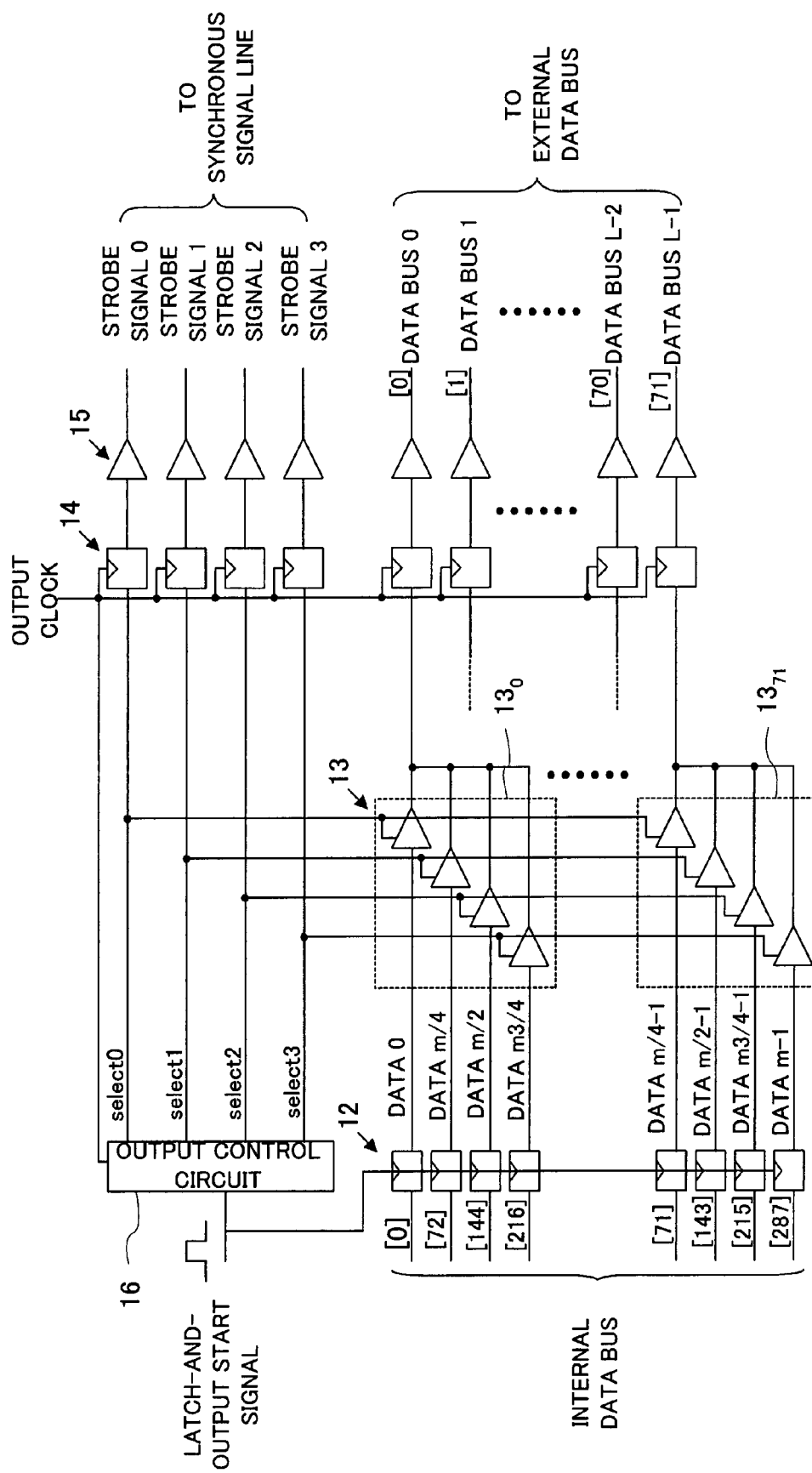
FIG. 2 is a circuit diagram showing an example of a data output device.
Figure 3:
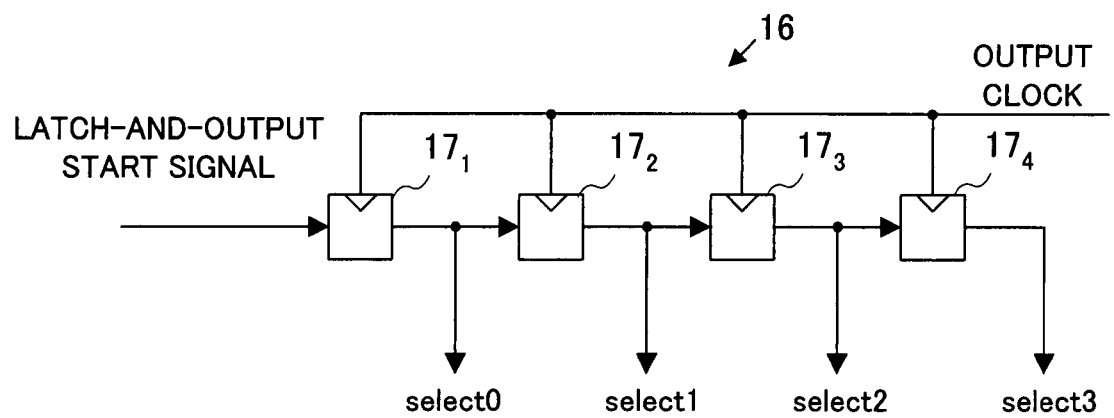
FIG. 3 is a circuit diagram showing an example of an output control circuit.
Figure 4:
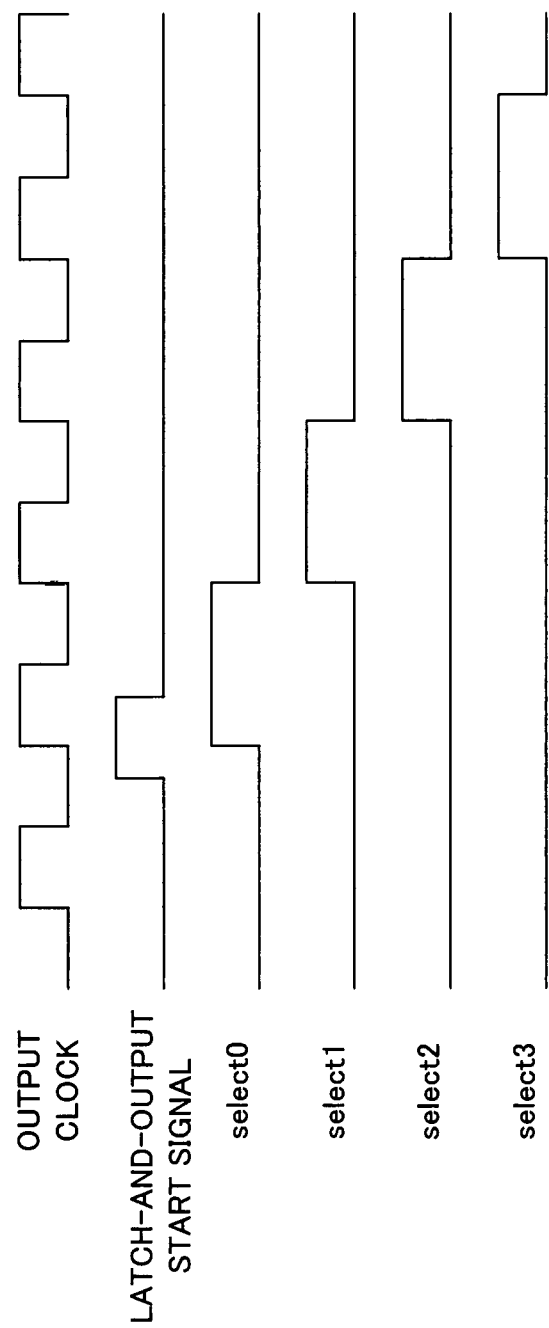
FIG. 4 is a view showing the waveforms of input to and output from an output control circuit.

FIG. 2 is a circuit diagram showing an example of a data output device. FIG. 3 is a circuit diagram showing an example of an output control circuit. FIG. 4 is a view showing the waveforms of input to and output from an output control circuit.

The data output device includes 288 latch circuits 12 for latching data on internal data buses. Output of the latch circuits 12 is connected to 72 multiplexers 13. Each multiplexer 13 includes four three-state buffers. Each of the four three-state buffers selects four pieces of data from four divided data blocks and outputs them.

For example, the first multiplexer $13_0$ inputs first data 0 in a first data block, first data 72 in a second data block, first data 144 in a third data block, and first data 216 in a fourth data block. The last 72nd multiplexer $13_{71}$ inputs 72nd data 71 in the first data block, 72nd data 143 in the second data block, 72nd data 215 in the third data block, and 72nd data 287 in the fourth data block.

Output of each multiplexer 13 is connected to an external data bus via an output latch circuit 14 and output buffer 15. The output latch circuit 14 latches data output from the multiplexer 13 in response to the leading edge of an output clock. If the frequency of this output clock is higher than or equal to a frequency four times the frequency of a system clock, all the divided data can be output in one cycle of the system clock. Therefore, it is preferable that the frequency of an output clock should be set to a value greater than or equal to a frequency four times the frequency of a system clock.

The multiplexer 13 selects data on the basis of four selection signals output from an output control circuit 16. As shown in FIG. 3, the output control circuit 16 includes four latch circuits $17_1$ through $17_4$ connected in series. A latch-and-output start signal synchronized with a system clock is input to data input of the first latch circuit $17_1$. An output clock is input to control input of each of the latch circuits $17_1$ through $17_4$.

As shown in FIG. 4, when a latch-and-output start signal at the high level is input to the latch circuit $17_1$ in the output control circuit 16, the latch circuit $17_1$ latches the latch-and-output start signal in response to the leading edge of an output clock and outputs selection signal select0. At the next leading edge of the output clock, the latch circuit $17_1$ latches the latch-and-output start signal at the low level and changes the output to the low level. The latch circuit $17_2$ at the next stage latches the selection signal select0 which has been at the high level, and outputs selection signal select1. The output control circuit 16 outputs selection signals, which are synchronized with the output clock, in order in this way.

Four selection signals generated by the output control circuit 16 are also output as strobe signals 0 through 3, respectively, via the output latch circuits 14 and output buffers 15.

First, when a latch-and-output start signal synchronized with a system clock is input to the data output device having the above structure, the latch circuits 12 latch all the data on the internal data buses. Then the multiplexers 13 accept first selection signal select0 from the output control circuit 16 and select the data 0 through 71 included in the first data block of the four divided data blocks. The selected data 0 through 71 are latched by the output latch circuits 14 and are output to the external data buses via the output buffers 15. When the next output clock is input, the multiplexers 13 accept second selection signal select1 from the output control circuit 16 and select the data 72 through 143 included in the second data block. The selected data 72 through 143 are latched by the output latch circuits 14 and are output to the external data buses via the output buffers 15. Similarly, the multiplexers 13 accept selection signals select2 and select3 in order from the output control circuit 16 and select in order data included in the third and fourth data block. The selected data is latched in order by the output latch circuits 14 and are output in order to the external data buses via the output buffers 15. In this case, the selection signals supplied to the multiplexers 13 are latched by the output latch circuits 14 and are output as strobe signals 0 through 3 to synchronous signal lines via the output buffers 15 with the data. Output of the strobe signals 0 through 3 and data will be completed in at least one cycle of a system clock.

By outputting a strobe signal and data at the leading edge of the same output clock in this data output device, a setup by the strobe signal can always be kept constant for each peace of data even after internal data being divided.

Figure 5:
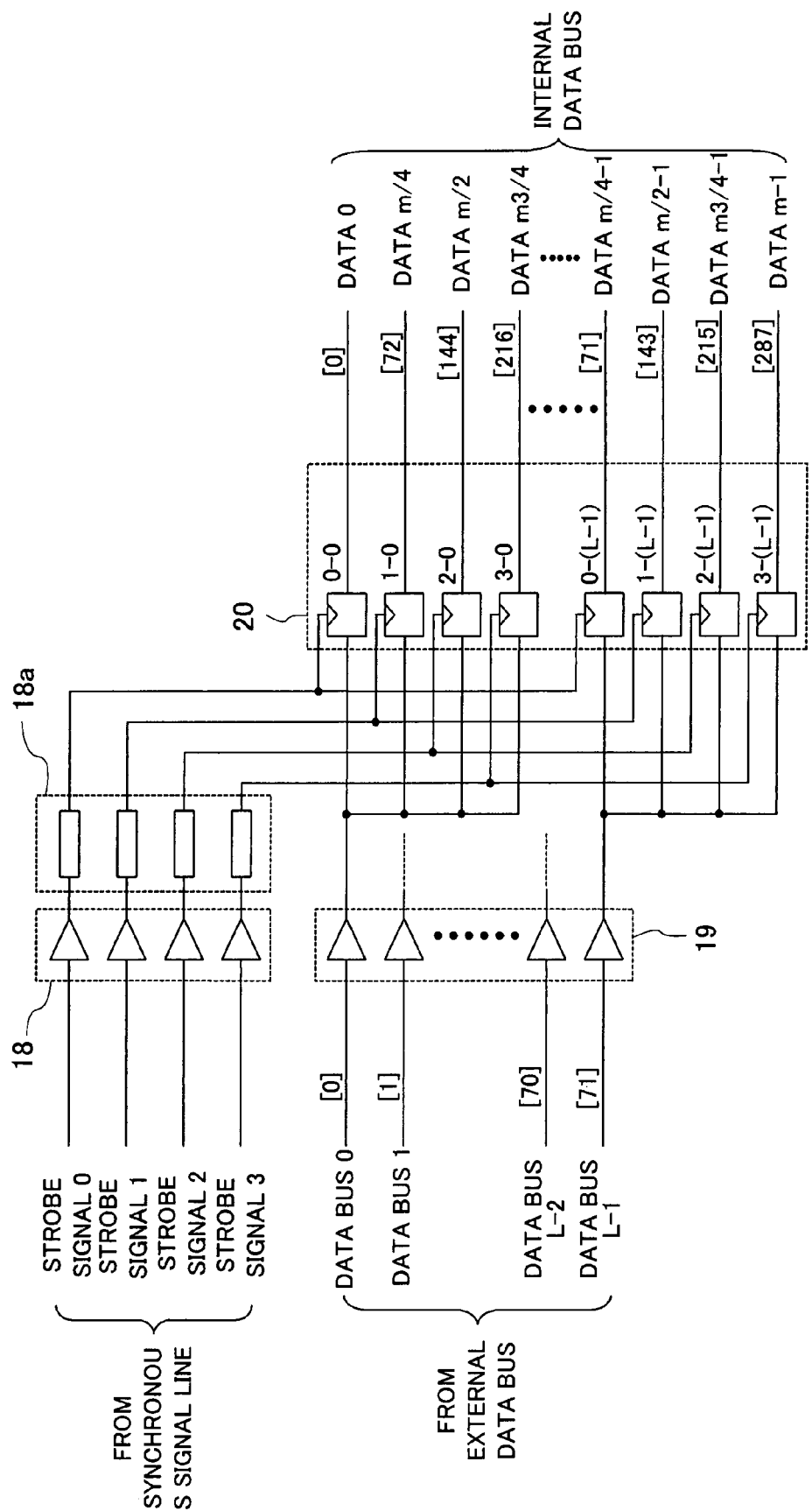
FIG. 5 is a circuit diagram showing an example of a data input device.
Figure 6:
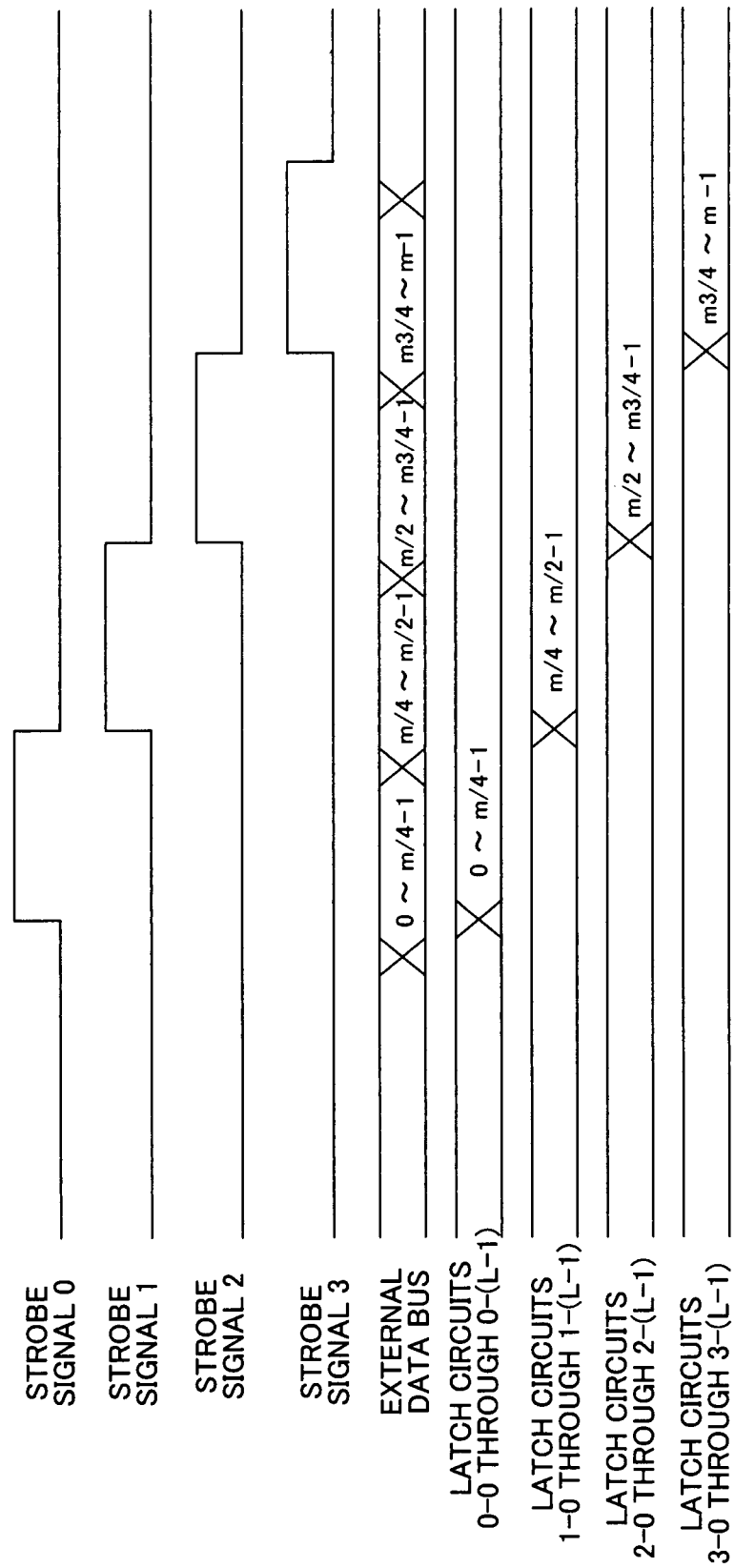
FIG. 6 is a view showing the waveforms of signals on a synchronous signal line and data on an external data bus.

FIG. 5 is a circuit diagram showing an example of a data input device. FIG. 6 is a view showing the waveforms of signals on a synchronous signal line and data on an external data bus.

A data input device includes an input buffer 18 for accepting four strobe signals on a synchronous signal line and an input buffer 19 for accepting 72 pieces of data on an external data bus. Output of the input buffer 19 for accepting data is connected to an input latch circuit 20. The input latch circuit 20 includes latch circuits the number of which is the same as that of internal data buses. One output terminal of the input buffer 19 is connected to data input of four latch circuits. For example, output of the input buffer 19 which accepts data on first data bus 0 is connected to data input of latch circuits 0-0, 1-0, 2-0, and 3-0 each of which latches the first piece of data included in a data block. Output of the input buffer 19 which accepts data on 72nd data bus L-1 is connected to data input of latch circuits 0-L-1, 1-L-1, 2-L-1, and 3-L-1 each of which latches the 72nd piece of data included in a data block.

Output of the input buffer 18 for accepting strobe signals is connected to the input latch circuit 20 via a setup guarantee delay circuit 18a. The setup guarantee delay circuit 18a gives a delay to a strobe signal to ensure setup time for data. Strobe signal 0 is input to control input of the first latch circuit from the top in the input latch circuit 20 shown in FIG. 5. The strobe signal 0 is also input to control input of every fifth latch circuit. Similarly, strobe signal 1 is input to control input of the second latch circuit from the top in the input latch circuit 20 shown in FIG. 5. The strobe signal 1 is also input to control input of every fifth latch circuit. Strobe signal 2 is input to control input of the third latch circuit from the top in the input latch circuit 20 shown in FIG. 5. The strobe signal 2 is also input to control input of every fifth latch circuit. Strobe signal 3 is input to control input of the fourth latch circuit from the top in the input latch circuit 20 shown in FIG. 5. The strobe signal 3 is also input to control input of every fifth latch circuit.

A data input device having the above structure is used to receive data. As shown in FIG. 6, when strobe signal 0 is at the high level, data 0 through 71 included in the first data block of four divided data blocks are on the external data bus. Therefore, latch circuits on the internal data bus corresponding to the data 0 through 71 are triggered by the strobe signal 0 and latch the data 0 through 71 on the external data bus. When strobe signal 1 is at the high level, data 72 through 143 included in the second data block are on the external data bus. Therefore, latch circuits on the internal data bus corresponding to the data 72 through 143 are triggered by the strobe signal 1 and latch the data 72 through 143 on the external data bus. Similarly, when strobe signal 2 is at the high level, data 144 through 215 included in the third data block are on the external data bus. Therefore, latch circuits on the internal data bus corresponding to the data 144 through 215 are triggered by the strobe signal 2 and latch the data 144 through 215 on the external data bus. When strobe signal 3 is at the high level, data 216 through 287 included in the fourth data block are on the internal data bus. Therefore, latch circuits on the internal data bus corresponding to the data 216 through 287 are triggered by the strobe signal 3 and latch the data 216 through 287 on the external data bus. As a result, all the data will be got.

With this data input device data is got only at the high edge of a strobe signal. Therefore, unlike a device of the double data rate type, the influence of the difference between the high and low edge characteristics of a driver which drives a strobe signal does not exist.

Furthermore, the width of got data can be restored to the original data bus width only with a strobe signal, so synchronous operations with a system clock or the like are unnecessary. As a result, divided data can be transmitted twice or more in one cycle of a system clock. By performing a transfer n times in one cycle, data before division can be transferred every cycle. This is useful in the case of the width of a data bus for a device mounted on, for example, a printed circuit board being too wide to easily design the printed circuit board. Moreover, the number of device package pins can be reduced, so the costs of the assembly of device packages can be cut.

Figure 7:
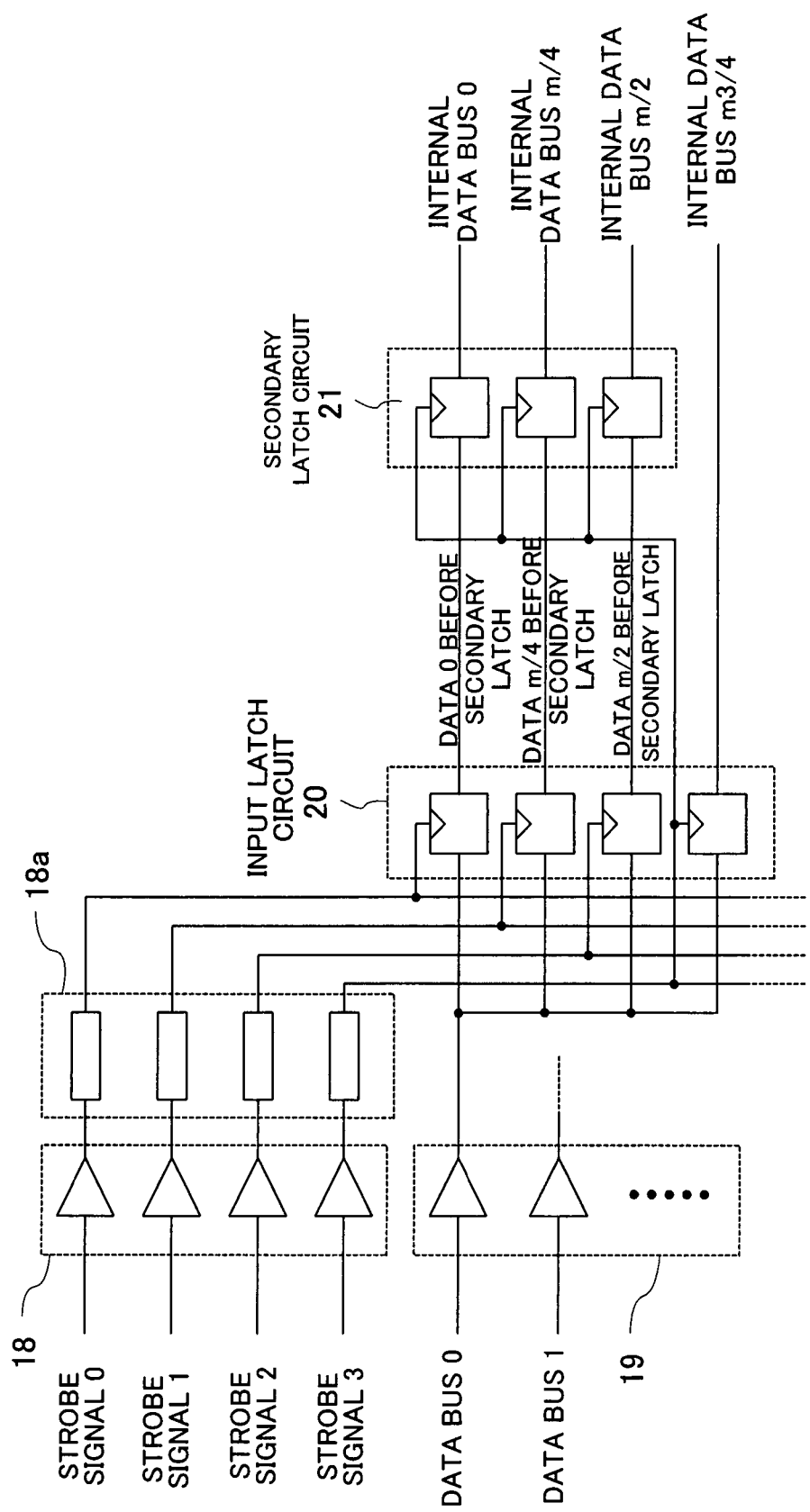
FIG. 7 is a circuit diagram showing a second example of a data input device.
Figure 8:
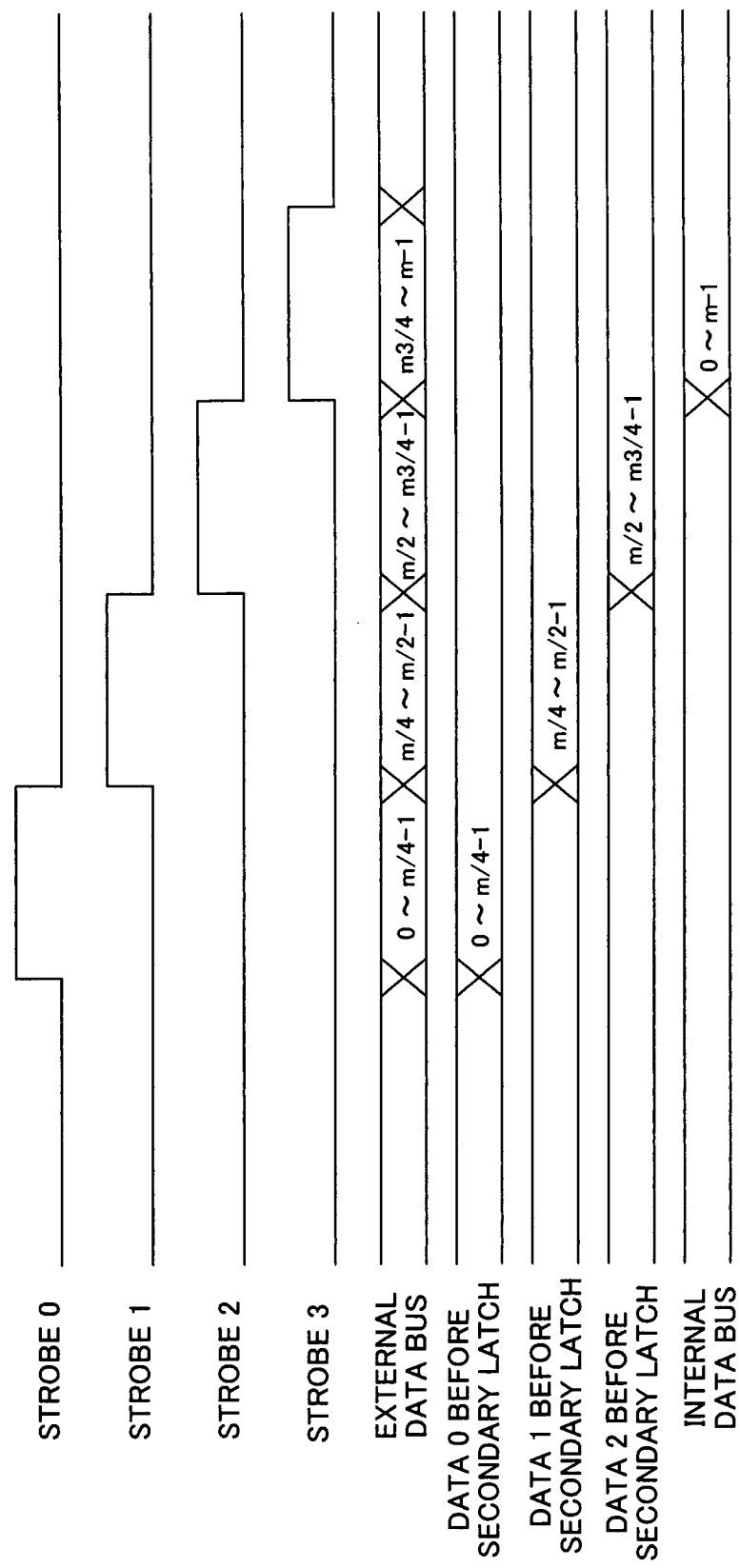
FIG. 8 is a view showing the waveforms of signals on synchronous signal lines, data on an external data bus, data before a secondary latch, and data on an internal data bus.

FIG. 7 is a circuit diagram showing a second example of a data input device. FIG. 8 is a view showing the waveforms of signals on synchronous signal lines, data on an external data bus, data before a secondary latch, and data on an internal data bus. Components shown in FIG. 7 which are the same as those shown in FIG. 5 are marked with the same symbols and detailed descriptions of them will be omitted.

This data input device includes three secondary latch circuits 21 behind three first latch circuits for latching data by a set of four strobe signals 0 through 3. The three secondary latch circuits 21 are triggered at the same time by the last strobe signal in a chain of data input, that is to say, by the fourth strobe signal 3 to latch again data held by the first latch circuits.

If strobe signals 0 through 3 are input at different times, the phases of pieces of internal data do not match. The three secondary latch circuits 21 are located to avoid this problem. As shown in FIG. 8, the phases of pieces of internal data on an internal data bus will match by locating the secondary latch circuits 21 in this way and by latching again data included in the first through third data blocks input and latched in advance by the secondary latch circuits 21 at the time of data in the fourth data block being got. As a result, the available period of internal data can be maximized.

Figure 9:
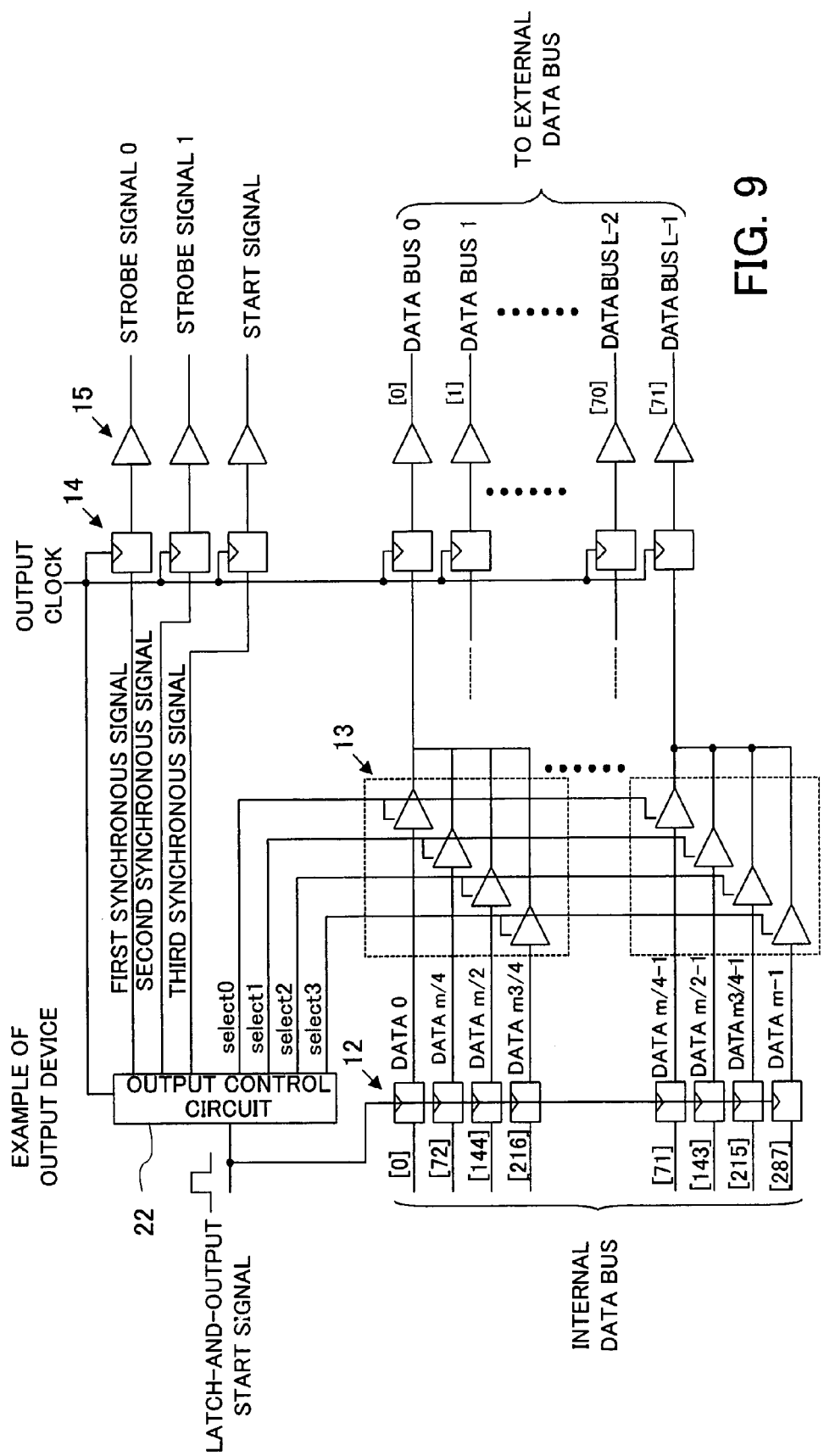
FIG. 9 is a circuit diagram showing a second example of a data output device.
Figure 10:
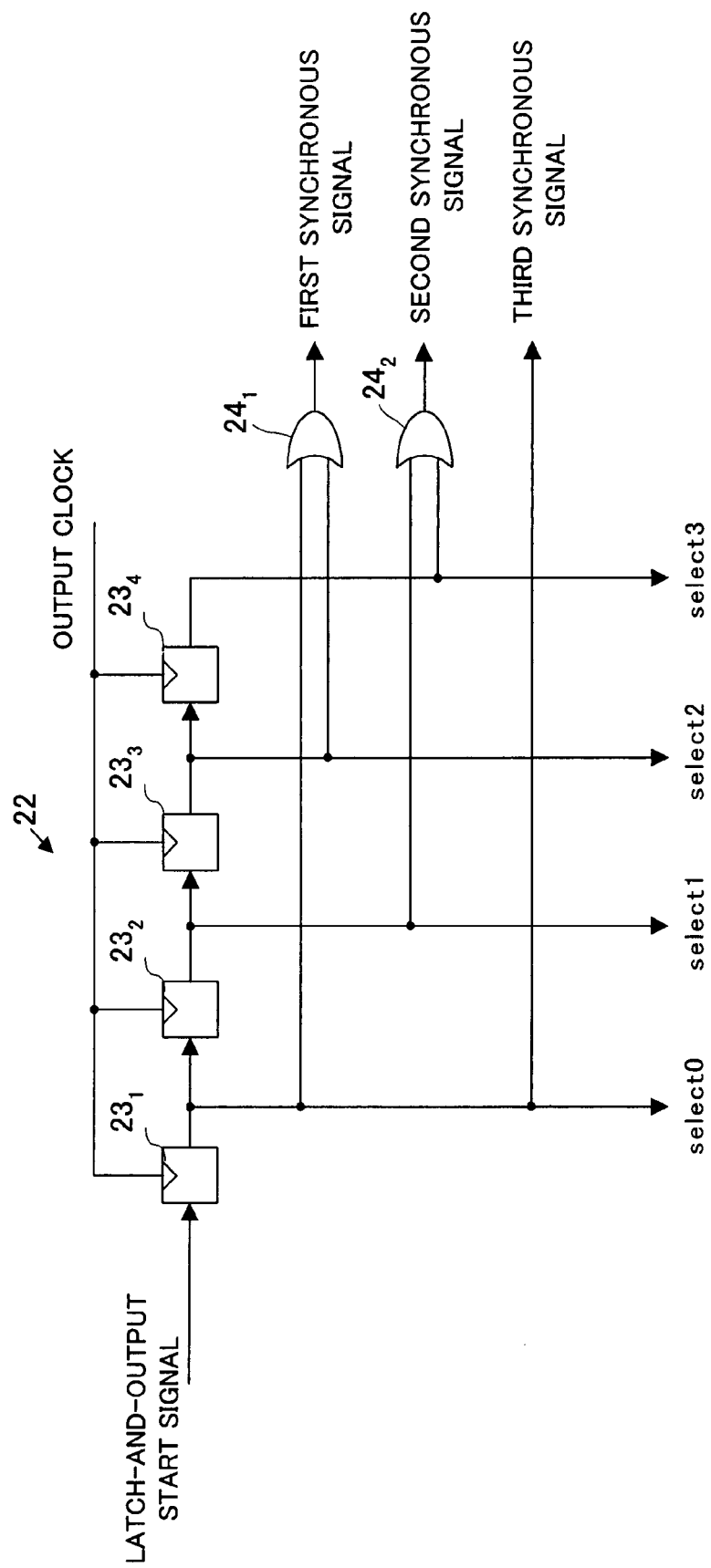
FIG. 10 is a circuit diagram showing an example of the output control circuit shown in FIG. 9.

FIG. 9 is a circuit diagram showing a second example of a data output device. FIG. 10 is a circuit diagram showing an example of the output control circuit shown in FIG. 9. Components shown in FIG. 9 which are the same as those shown in FIG. 2 are marked with the same symbols and detailed descriptions of them will be omitted.

An output control circuit 22 in this data output device generates not only selection signals select0 through select3 but also first through third synchronous signals and outputs these synchronous signals with data.

As shown in FIG. 10, the output control circuit 22 includes four latch circuits $23_1$ through $23_4$ connected in series and two OR gates $24_1$ and $24_2$. A latch-and-output start signal is input to data input of the first latch circuit $23_1$. An output clock is input to control input of each of the latch circuits $23_1$ through $23_4$. The latch circuits $23_1$ through $23_4$ output selection signals select0 through select3 respectively. The OR gate $24_1$ accepts output from the latch circuits $23_1$ and $23_3$ at two input terminals respectively and outputs a first synchronous signal. The OR gate $24_2$ accepts output from the latch circuits $23_2$ and $23_4$ at two input terminals respectively and outputs a second synchronous signal. The latch circuit $23_1$ outputs a third synchronous signal.

These first through third synchronous signals are latched by output latch circuits 14 triggered by an output clock and are output via output buffers 15. In this case, the first and second synchronous signals are used as strobe signals 0 and 1, respectively, for getting data and the third synchronous signal is used as a start signal for indicating the beginning of data. The strobe signals 0 and 1 are complementary signals. That is to say, each time data is output, the states of the strobe signals 0 and 1 change reversely. Data is got only at their high edges. A start signal goes into the high level only when data included in the first data block is output.

Figure 11:
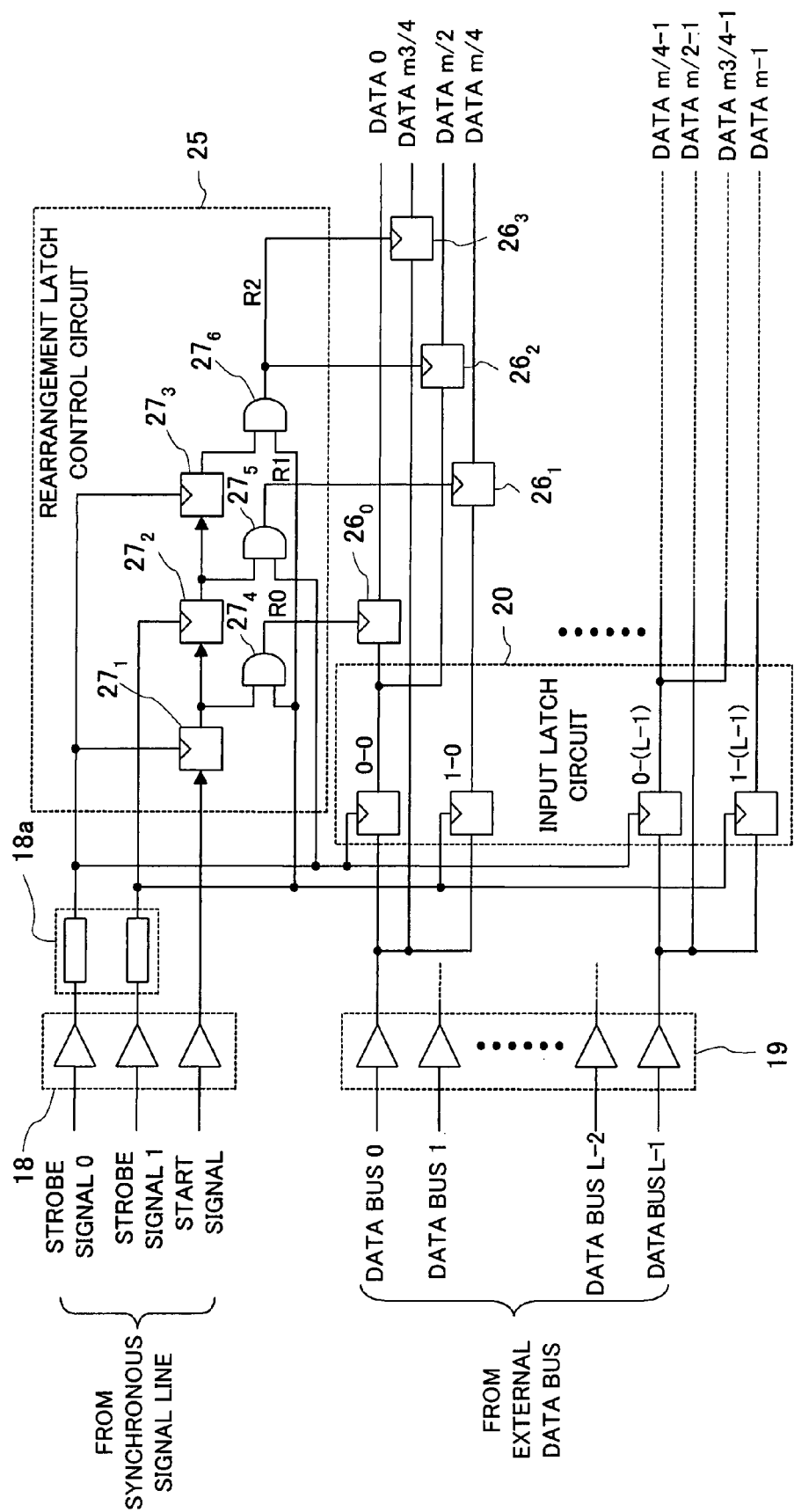
FIG. 11 is a circuit diagram showing a third example of a data input device.
Figure 12:
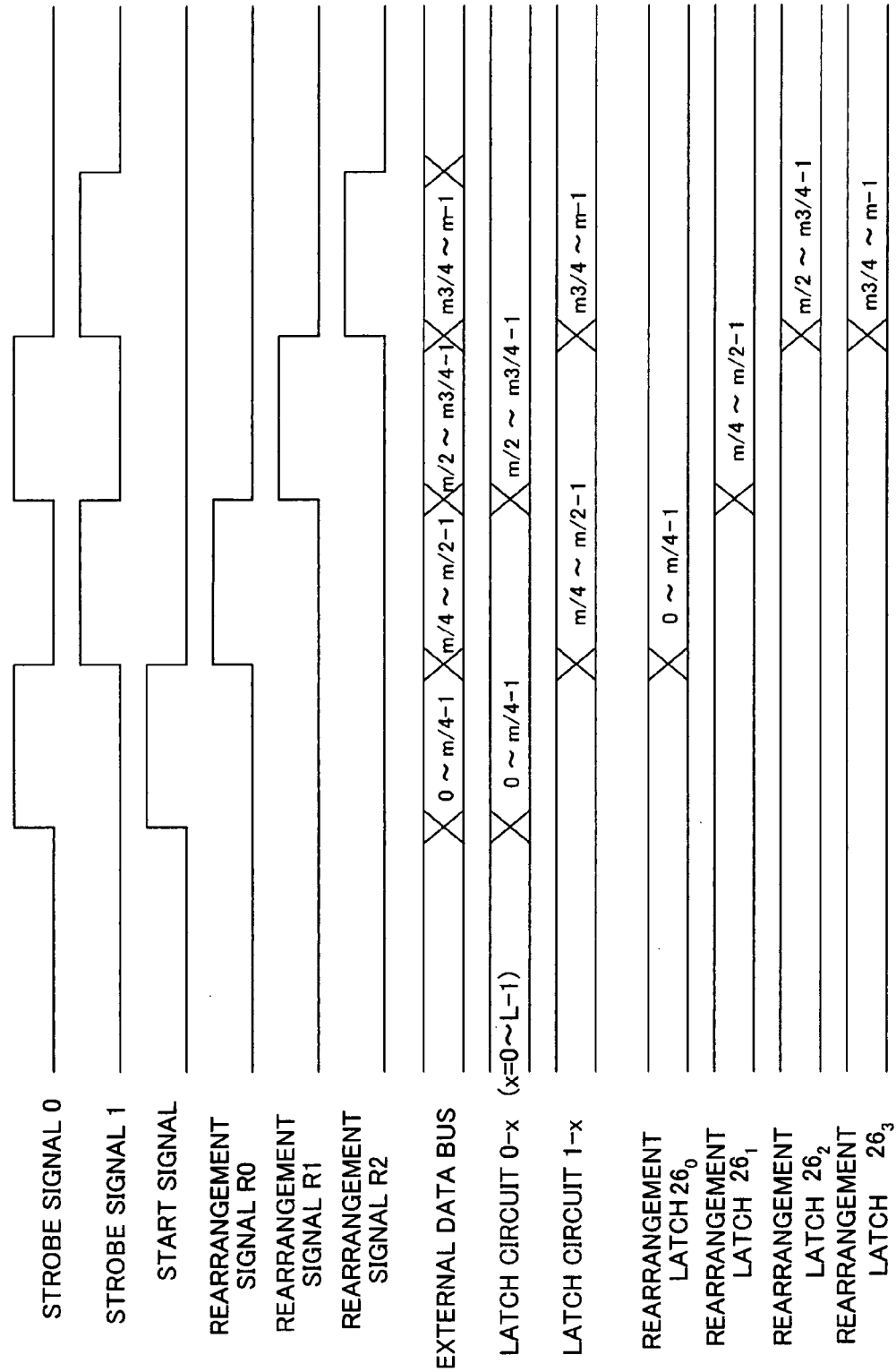
FIG. 12 is a view showing the waveforms of signals in the feature of a data input device.

FIG. 11 is a circuit diagram showing a third example of a data input device. FIG. 12 is a view showing the waveforms of signals in the feature of a data input device. Components shown in FIG. 11 which are the same as those shown in FIG. 5 are marked with the same symbols and detailed descriptions of them will be omitted.

An input buffer 18 in this data input device accepts strobe signals 0 and 1 and a start signal. The strobe signals 0 and 1 are delayed properly by a setup guarantee delay circuit 18*a*. L output terminals of an input buffer 19 which accepts data on an external data bus are connected to data input of the corresponding latch circuits 0-0 and 1-0, 0-1 and 1-1, . . . , and 0-(L-1) and 1-(L-1), respectively, in an input latch circuit 20. The strobe signal 0 is input to control input of the latch circuits 0-0 through 0-(L-1) and the strobe signal 1 is input to control input of the latch circuits 1-0 through 1-(L-1). This data input device also includes a rearrangement latch control circuit 25 and rearrangement latches $26_0$ through $26_3$ connected to each output terminal of the input latch circuit 20.

The rearrangement latch control circuit 25 includes three latch circuits $27_1$, $27_2$, and $27_3$. The latch circuit $27_1$ accepts the start signal at the data input and accepts the strobe signal 0 at the control input. Output of the latch circuit $27_1$ is connected to data input of the latch circuit $27_2$ at the next stage. The latch circuit $27_2$ accepts the strobe signal 1 at the control input. Output of the latch circuit $27_2$ is connected to data input of the latch circuit $27_3$ at the next stage. The latch circuit $27_3$ accepts the strobe signal 0 at the control input. The output of the latch circuit $27_1$ is connected to one input terminal of an AND gate $27_4$. The AND gate $27_4$ accepts the strobe signal 1 at the other input terminal. Output from the AND gate $27_4$, being rearrangement signal R0, is input to control input of the rearrangement latch $26_0$. The output of the latch circuit $27_2$ is connected to one input terminal of an AND gate $27_5$. The AND gate $27_5$ accepts the strobe signal 0 at the other input terminal. Output from the AND gate $27_5$, being rearrangement signal R1, is input to control input of the rearrangement latch $26_1$. The output of the latch circuit $27_3$ is connected to one input terminal of an AND gate $27_6$. The AND gate $27_6$ accepts the strobe signal 1 at the other input terminal. Output from the AND gate $27_6$, being rearrangement signal R2, is input to control input of the rearrangement latches $26_2$ and $26_3$.

Data got into the latch circuits 0-0 through 0-(L-1) or 1-0 through 1-(L-1) in this data input device in response to the complementary strobe signals 0 and 1 is got into the predetermined rearrangement latches $26_0$ through $26_3$ by the rearrangement signals R0 through R2 output from the rearrangement latch control circuit 25. That is to say, data included in the first data block is latched by the latch circuits 0-0 through 0-(L-1) in the input latch circuit 20 in response to the strobe signal 0. Then data included in the second data block is latched by the latch circuits 1-0 through 1-(L-1) in the input latch circuit 20 in response to the strobe signal 1 and the data latched by the latch circuits 0-0 through 0-(L-1) is latched by the rearrangement latch $26_0$ in response to the rearrangement signal R0. And then data included in the third data block is latched by the latch circuits 0-0 through 0-(L-1) in the input latch circuit 20 in response to the strobe signal 0 and the data latched by the latch circuits 1-0 through 1-(L-1) is latched by the rearrangement latch $26_1$ in response to the rearrangement signal R1. In response to the rearrangement signal R2, data included in the fourth data block is latched by the rearrangement latch $26_3$ and the data latched by the latch circuits 0-0 through 0-(L-1) in the input latch circuit 20 is latched by the rearrangement latch $26_2$. At this time the data included in the fourth data block is latched by the latch circuits 1-0 through 1-(L-1) in the input latch circuit 20 in response to the strobe signal 1, but it will not be used.

As stated above, the rearrangement latch control circuit 25 outputs rearrangement signals R0 through R2 got in order into the rearrangement latches $26_0$ through $26_3$, into which input data should be got each time strobe signals 0 and 1 change, on the basis of a start signal. As a result, data included in the first through fourth data blocks will be got into the rearrangement latches $26_0$ through $26_3$ respectively.

Figure 13:
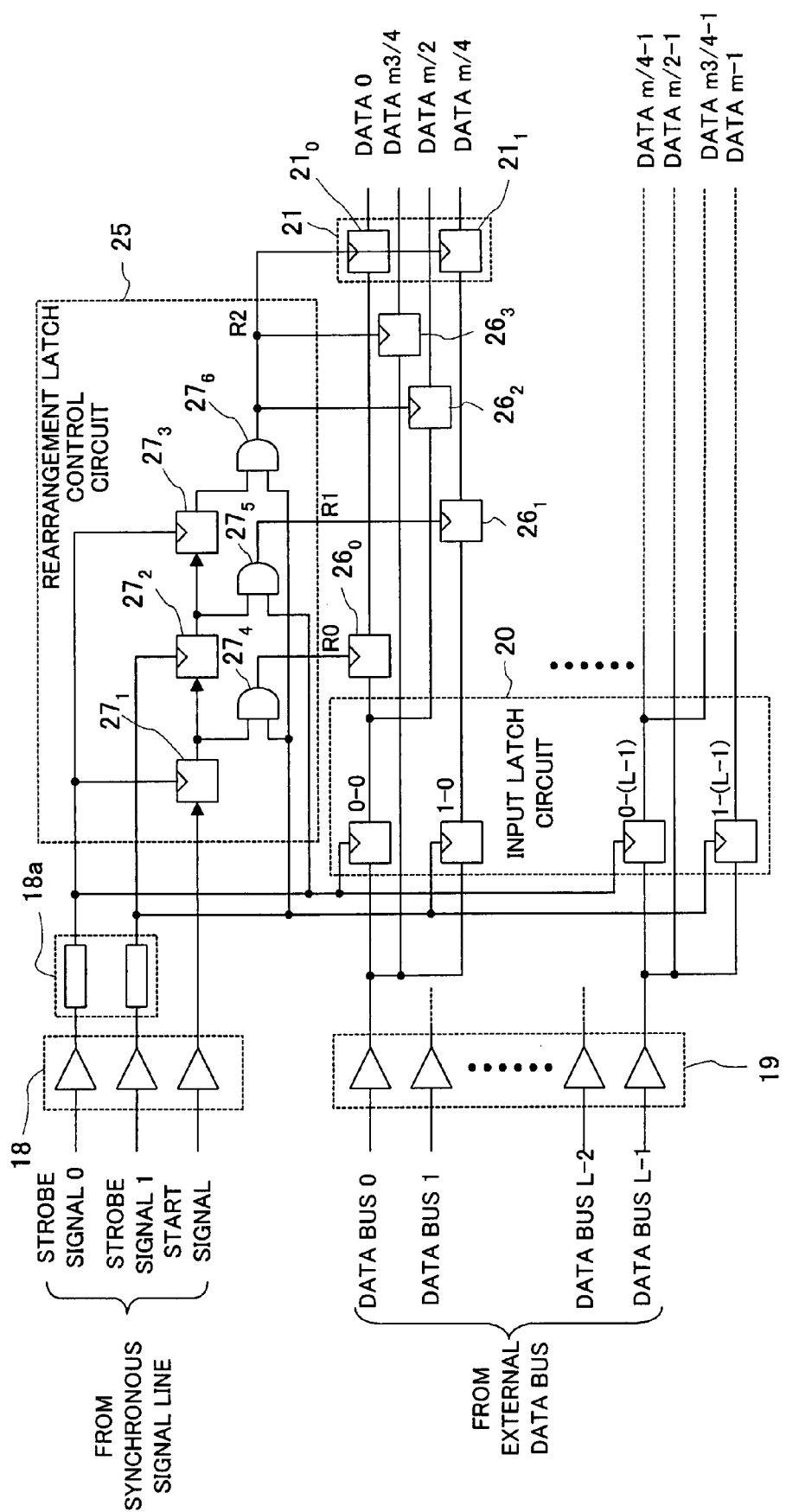
FIG. 13 is a circuit diagram showing a fourth example of a data input device.
Figure 14:
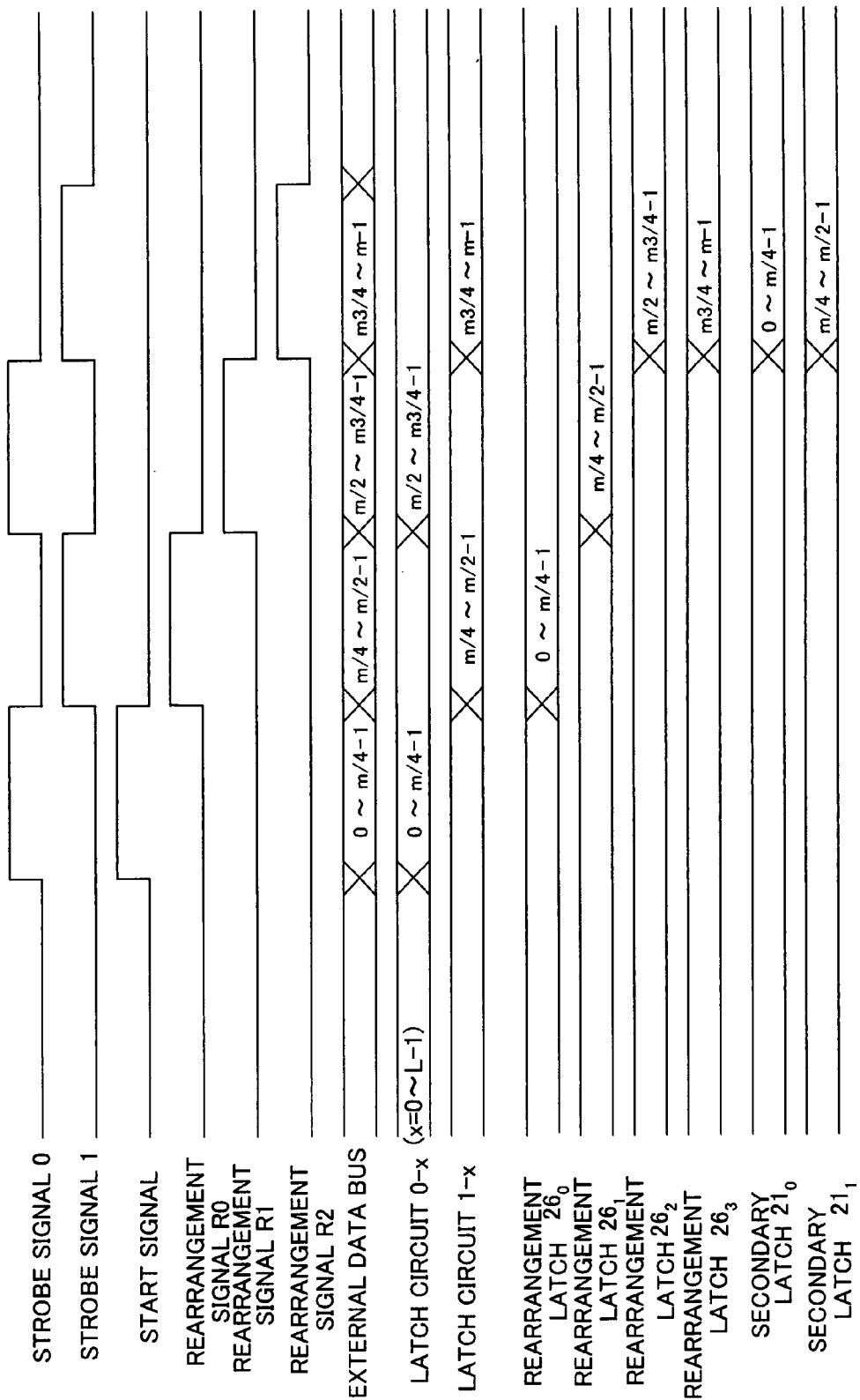
FIG. 14 is a view showing the waveforms of signals in the feature of a data input device.
Figure 15:
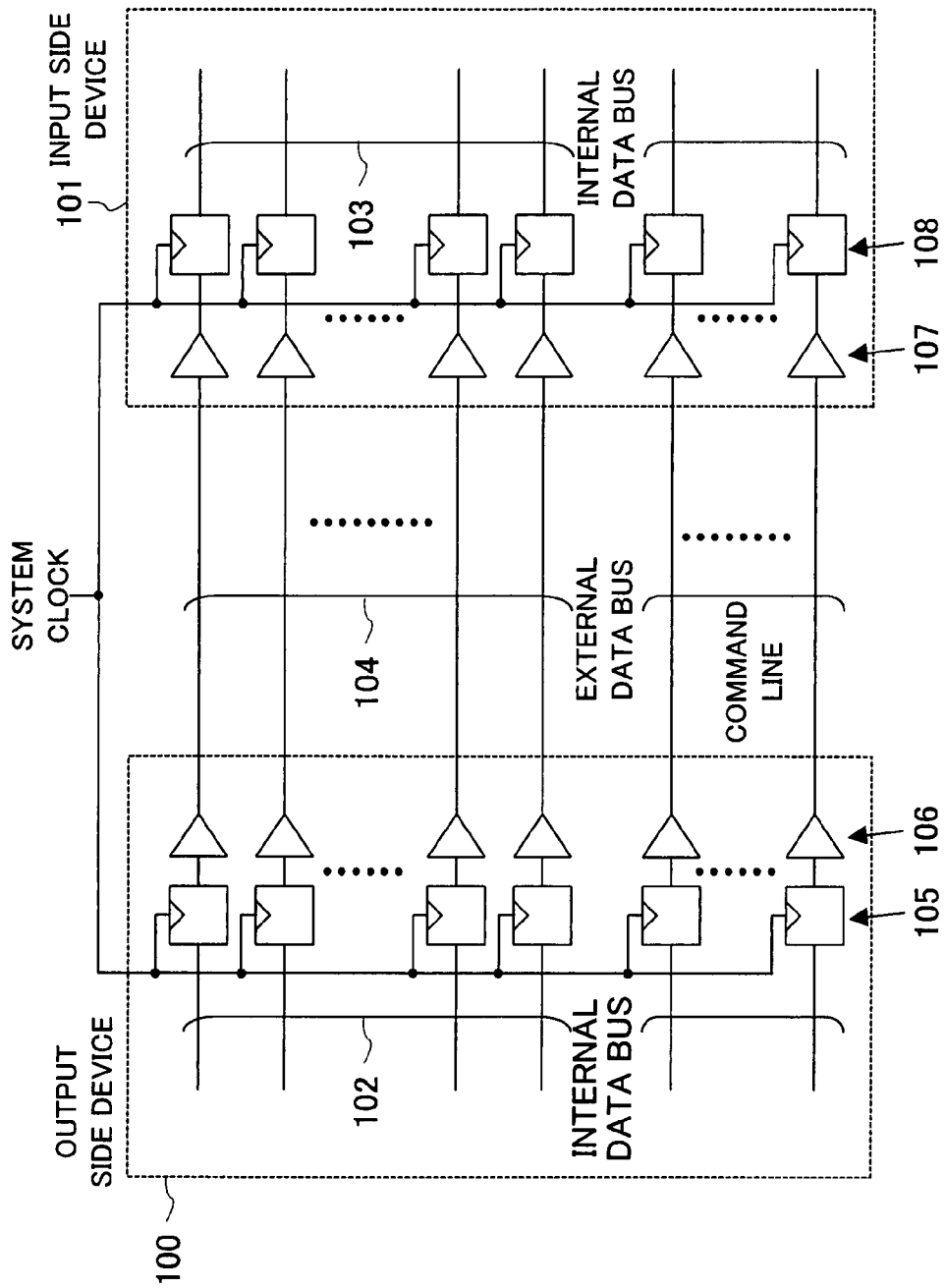
FIG. 15 is a circuit diagram showing an example of conventional circuits for transferring data.
Figure 16:
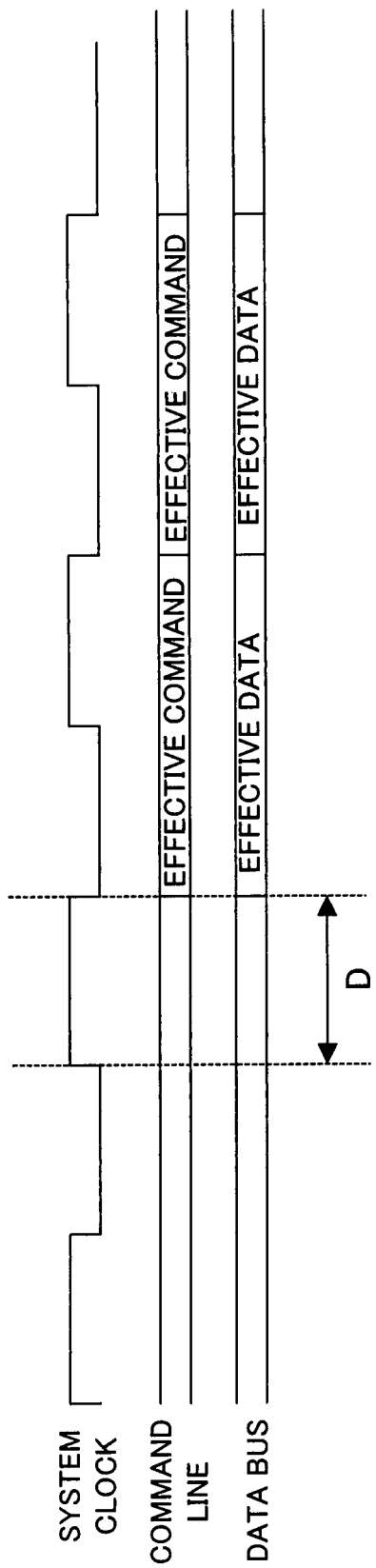
FIG. 16 is a view showing an example of the waveforms of data transferred under a single data rate method.
Figure 17:
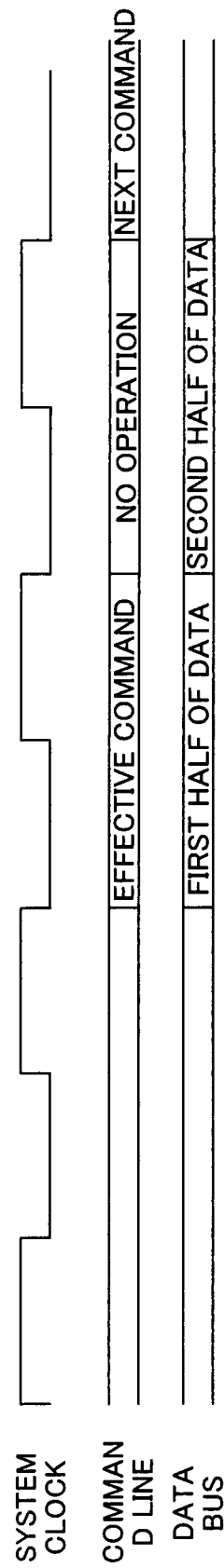
FIG. 17 is a view showing an example of the waveforms of data of a width twice the width of a bus which is transferred under the single data rate method.
Figure 18:
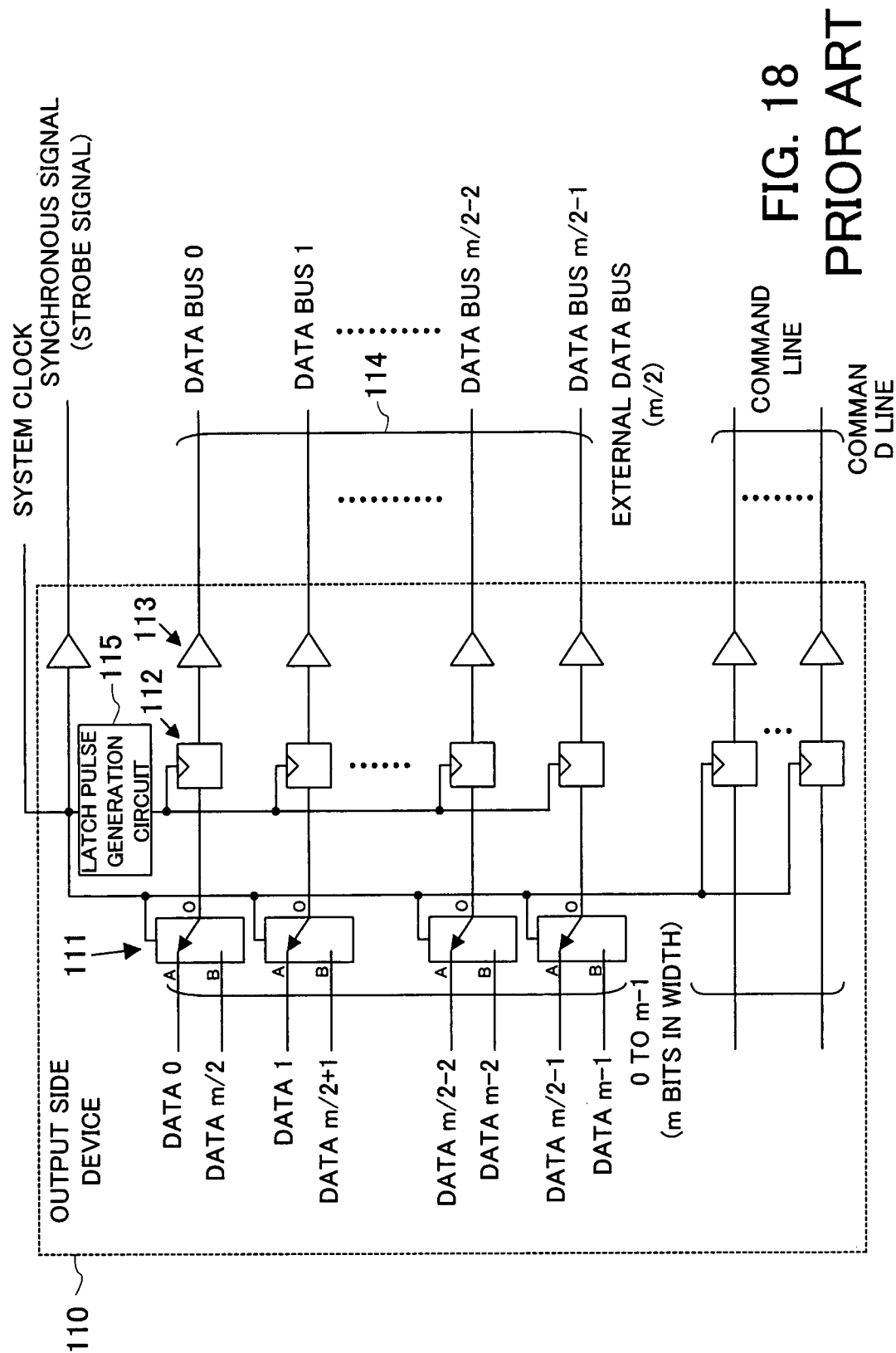
FIG. 18 is a circuit diagram showing an example of conventional output side devices of a double data rate type.
Figure 20:
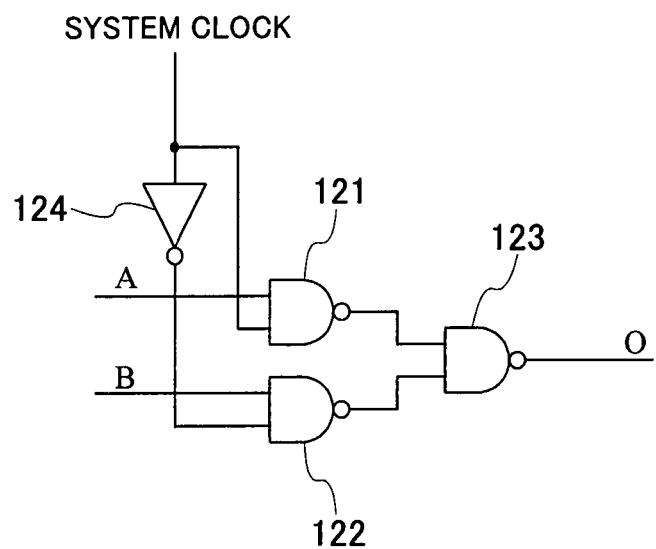
FIG. 20 is a circuit diagram showing an example of a data selector.
Figure 21:
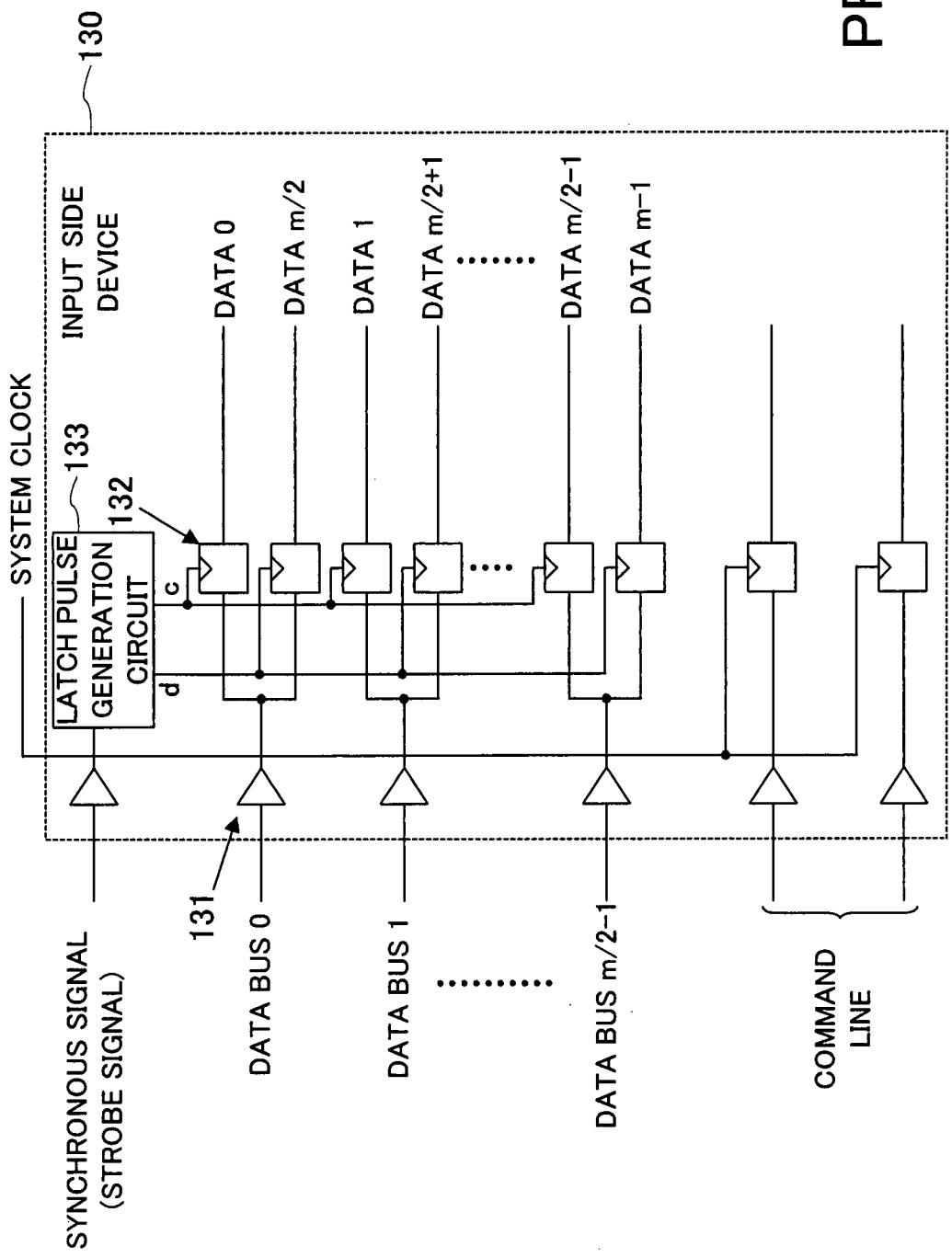
FIG. 21 is a circuit diagram showing an example of conventional input side devices of a double data rate type.

FIG. 13 is a circuit diagram showing a fourth example of a data input device. FIG. 14 is a view showing the waveforms of signals in the feature of a data input device. Components shown in FIG. 13 which are the same as those shown in FIGS. 7 and 11 are marked with the same symbols and detailed descriptions of them will be omitted.

This data input device has a structure obtained by combining the data input device including the secondary latch circuits 21 as shown in FIG. 7 and the input device shown in FIG. 11 which rearranges data.

That is to say, this data input device includes a secondary latch circuit 21 with a secondary latch $21_0$ connected to output of a rearrangement latch $26_0$ which rearranges data included in the first data block got before data included in the second data block at the time of transferring the data included in the second data block and a secondary latch $21_1$ connected to output of a rearrangement latch $26_1$ which rearranges data included in the second data block got before data included in the third data block at the time of transferring the data included in the third data block. The secondary latches $21_0$ and $21_1$ are triggered by rearrangement signal R2 used to rearrange the data included in the third data block and to get data included in the fourth data block.

The data input device having the above structure begins to get data on the basis of a start signal. At this time data input alternately to two sets of latch circuits, that is to say, to latch circuits 0-0 through 0-(L-1) and 1-0 through 1-(L-1) in an input latch circuit 20 is got in response to complementary strobe signals 0 and 1. Data got before is shifted to the rearrangement latch $26_0$ or $26_1$ in response to rearrangement signals R0 through R2 output from the rearrangement latch control circuit 25. Finally data got just before is shifted to the rearrangement latch $26_2$, the last data is got, and data which has been got into the rearrangement latches $26_0$ and $26_1$ is latched again by the secondary latches $21_0$ and $21_1$. As a result, the phases of all pieces of internal data match and the available period of internal data can be maximized.

As has been described in the foregoing, with the output side device according to the present invention data in wide bus width on an internal data bus is divided into n data blocks and is transferred. In this case, a synchronous signal indicative of which data block transferred data is included in is sent at the same time as the data. With the input side device according to the present invention input data is got on the basis of a synchronous signal transferred at the same time as the data. Therefore, data in wide bus width on an internal data bus can be transferred regardless of the width of an external data bus.

There are physical restrictions as to the number of package pins. Therefore, if the width of a bus for internal data is too wide, a sufficient number of package pins to be assigned to an external data bus cannot be ensured. Even in such cases, internal data can be transferred. As a result, the costs of the assembly of device packages can be cut.

Moreover, if the width of a data bus for an input device or an output device mounted on, for example, a printed circuit board is too wide, it may be difficult to design the printed circuit board. The present invention is useful in such a case.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A semiconductor device which outputs internal data to an external data bus, the device comprising;
   an internal data bus, a width of which is four times wider than a width of the external data bus;
   an output control circuit configured to generate a plurality of selection signals in parallel in response to an output start signal;
   a data selection circuit configured to select a data block from four divided data blocks on the internal data bus according to the selection signals which are supplied in parallel to the data selection circuit;
   a data output section configured to output the data in the data block selected by the data selection circuit to the external data bus; and
   a synchronous signal output section configured to output strobe signals to synchronous signal lines in response to the selection signals.

2. The semiconductor device according to claim 1, wherein the synchronous signal output section operates in synchronization with a system clock to align strobe signal transitions with the system clock.

3. The semiconductor device according to claim 1, wherein the synchronous signal output section operates in synchronization with a first s stem system clock and the data output section operates in synchronization with a second output clock.

4. The semiconductor device according to claim 1, wherein the data selection circuit includes a plurality of multiplexers configured to select a datablock from data blocks,
wherein each of the plurality of selection signals is supplied to the corresponding multiplexers.

5. The semiconductor device according to claim 1, further comprising:
an internal data latch circuit configured to latch data inputted from the outside of the semiconductor device.

6. The semiconductor device according to claim 1, wherein the data selection circuit includes an internal data latch circuit configured to latch data inputted from the outside of the semiconductor device.

7. The semiconductor device according to claim 1, wherein the data output section includes output latch circuits configured to latch-data selected by the data selection circuit in synchronization with a second (output) clock signal.

8. The semiconductor device according to claim 1, wherein the data output section includes output buffers configured to output data latched by the output latch circuits to the external data bus.

9. The semiconductor device according to claim 1, wherein the synchronous signal output section outputs the strobe signals in synchronization with the data.

10. A semiconductor device which outputs internal data to an external data bus of a width narrower than the width of an internal data bus, the device comprising:
an output control circuit configured to generate a plurality of selection signals and output the plurality of selection signals in parallel in response to an output start signal;
a data selection circuit configured to select a data block from n divided data blocks on the internal data bus having a width of m bits according to the selection signals which are supplied in parallel to the data selection circuit;
a data output section configured to output the data in the data block selected by the data selection circuit to the external data bus having a width of m/n bits; and
a synchronous signal output section configured to output strobe signals to synchronous signal lines in response to the selection signals.

11. The semiconductor device according to claim 10, wherein the synchronous signal output section operates in synchronization with a system clock to align strobe signal transitions with the system clock.

12. The semiconductor device according to claim 10, wherein the synchronous signal output section operates in synchronization with a first system clock and the data output section operates in synchronization with a second output clock.

13. The semiconductor device according to claim 10, wherein the data selection circuit includes a plurality of multiplexers configured to select a data block from data blocks,
wherein each of the plurality of selection signals is supplied to the corresponding multiplexer.

14. The semiconductor device according to claim 10, further comprising:
an internal data latch circuit configured to latch data inputted from the outside of the semiconductor device.

15. The semiconductor device according to claim 10, wherein the data selection circuit includes an internal data latch circuit configured to latch data inputted from the outside of the semiconductor device.

16. The semiconductor device according to claim 10, wherein the data output section includes output latch circuits configured to latch data selected by the data selection circuit in synchronization with a second output clock signal.

17. The semiconductor device according to claim 10, wherein the data output section includes output buffers configured to output data latched by the output latch circuits to the external data bus.

18. The semiconductor device according to claim 10, wherein the synchronous signal output section outputs the strobe signals in synchronization with the data.

19. A semiconductor device which outputs internal data to an external data bus, the device comprising:
an internal data bus, a width of which is four times wider than a width of the external data base;
an output control circuit configures to generate a plurality of selection signals in parallel in response to an output start signal;
a data selection circuit configured to select a data block from four divided data blocks on the internal data bus according to the selection signals which are supplied in parallel to the data selection circuit;
a data output section configured to output data in the data block selected by the data selection circuit to the external data bus; and
a synchronous signal output section configured to output strobe signals corresponding to the selection signals to synchronous signal lines in synchronized with an output of the data in the data block selected by the data selection circuit based on the selection signals from the data output section.

20. A semiconductor device which outputs internal data to an external data bus of a width narrower than the width of an internal data bus, the device comprising:
an output control circuit configured to generate a plurality of selection signals and output the plurality of selection signals in parallel in response to an output start signal;
a data selection circuit configured to select a data block from n divided data blocks on the internal data bus having a width of m bits according to the selection signals which are supplied in parallel to the data selection circuit;
a data output section configured to output the data in the data block selected by the data selection circuit to the external data bus having a width of m/n bits; and
a synchronous signal output section configured to output strobe signals corresponding to the selection signals to synchronous signal lines in synchronized with an output of the data in the data block selected by the data selection circuit based on the selection signals from the data output section.

* * * * *